United States Patent
Han

(10) Patent No.: US 11,675,403 B2
(45) Date of Patent: Jun. 13, 2023

(54) ELECTRONIC CIRCUIT FOR OUTPUTTING VOLTAGE BASED ON A PLURALITY OF INPUT VOLTAGES

(71) Applicant: SAMSUNG ELECTRONICS CO., LTD., Suwon-si (KR)

(72) Inventor: Heeseok Han, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 28 days.

(21) Appl. No.: 16/433,977

(22) Filed: Jun. 6, 2019

(65) Prior Publication Data
US 2020/0091715 A1    Mar. 19, 2020

(30) Foreign Application Priority Data

Sep. 18, 2018  (KR) .................. 10-2018-0111339

(51) Int. Cl.
*G06F 1/26* (2006.01)
*H02J 1/10* (2006.01)
(Continued)

(52) U.S. Cl.
CPC .............. *G06F 1/26* (2013.01); *G06F 1/3296* (2013.01); *G11C 5/147* (2013.01); *H02J 1/084* (2020.01); *H02J 1/102* (2013.01)

(58) Field of Classification Search
CPC ........ G06F 1/26–3296; H02J 1/08–086; H02J 1/10–109
See application file for complete search history.

(56) References Cited

U.S. PATENT DOCUMENTS

| 5,894,413 A | 4/1999 | Ferguson |
| 6,987,333 B2 | 6/2006 | Winick et al. |

(Continued)

FOREIGN PATENT DOCUMENTS

| JP | H5064359 A2 | 3/1993 |
| JP | 2008009683 A | 1/2008 |

(Continued)

OTHER PUBLICATIONS

"Selecting an Linear Regulator (LDO)", Apr. 11, 2018, Richtek, retrieved via Wayback machine. (Year: 2018).*

(Continued)

*Primary Examiner* — Rexford N Barnie
*Assistant Examiner* — David A Shiao
(74) *Attorney, Agent, or Firm* — Volentine, Whitt & Francos, PLLC

(57) ABSTRACT

Based on a first signal, a first voltage output circuit outputs a first output voltage which is based on a first voltage or does not output the first output voltage. Based on a second signal, a second voltage output circuit outputs a second output voltage which is based on a second voltage or does not output the second output voltage. When a level of the first voltage is lower than a reference level, a voltage detector circuit outputs the first signal such that the first voltage output circuit does not output the first output voltage and outputs the second signal such that the second voltage output circuit outputs the second output voltage. The second voltage output circuit outputs the second output voltage such that the second output voltage has a level of the first output voltage when the level of the first voltage is the reference level.

13 Claims, 19 Drawing Sheets

(51) Int. Cl.
 *H02J 1/08* (2006.01)
 *G06F 1/3296* (2019.01)
 *G11C 5/14* (2006.01)

(56) References Cited

U.S. PATENT DOCUMENTS

| | | | |
|---|---|---|---|
| 9,812,897 B2 | 11/2017 | Rodrigues | |
| 2006/0158809 A1* | 7/2006 | Shin | H02J 1/10 361/90 |
| 2008/0018174 A1* | 1/2008 | Yang | H02J 7/08 307/80 |
| 2012/0169660 A1 | 7/2012 | Seo | |
| 2013/0313903 A1* | 11/2013 | Kayama | G06F 1/263 307/26 |
| 2014/0346878 A1* | 11/2014 | Umeyama | H03K 3/012 307/52 |
| 2015/0194886 A1* | 7/2015 | Zanetta | G05F 1/573 327/309 |
| 2015/0333568 A1* | 11/2015 | Batra | H02J 9/061 307/66 |
| 2016/0109932 A1* | 4/2016 | Jeon | G11C 5/14 713/323 |
| 2016/0111134 A1* | 4/2016 | Kim | G11C 5/143 365/226 |
| 2016/0306412 A1* | 10/2016 | Kolla | G11C 5/063 |
| 2016/0308355 A1* | 10/2016 | Price | H03K 5/2481 |
| 2016/0328076 A1 | 11/2016 | Pan | |
| 2018/0019673 A1* | 1/2018 | Cai | G05F 1/59 |
| 2018/0284859 A1* | 10/2018 | Pant | G06F 1/263 |
| 2018/0348838 A1* | 12/2018 | Cox | G06F 3/0634 |
| 2019/0173274 A1* | 6/2019 | Fukae | H02J 1/06 |
| 2020/0278713 A1* | 9/2020 | Hashemi | G06F 1/28 |

FOREIGN PATENT DOCUMENTS

| | | |
|---|---|---|
| JP | 2008086148 A | 4/2008 |
| JP | 2014204572 A | 10/2014 |

OTHER PUBLICATIONS

IAmAProgrammer, "OpAmp Voltage Follower/Regulator", Sep. 5, 2015, cnblogs.com, <https://www.cnblogs.com/shangdawei/p/4783042.html>. (Year: 2015).*

"Voltage divider", Sep. 4, 2018, Wikipedia, retrieved via Wayback Machine at <https://web.archive.org/web/20180904112228/https://en.wikipedia.org/wiki/Voltage_divider> (Year: 2018).*

European Office Action dated Oct. 21, 2021 Cited in EP Patent Application No. 19161955.0.

* cited by examiner

ELECTRONIC CIRCUIT FOR OUTPUTTING VOLTAGE BASED ON A PLURALITY OF INPUT VOLTAGES

CROSS-REFERENCE TO RELATED APPLICATIONS

This application claims priority under 35 U.S.C. § 119 to Korean Patent Application No. 10-2018-0111339 filed on Sep. 18, 2018, in the Korean Intellectual Property Office, the disclosure of which is incorporated by reference herein in its entirety.

BACKGROUND

Embodiments of the disclosure described herein relate to an electronic circuit, and more particularly, relate to an electronic circuit for outputting a voltage based on a plurality of input voltages.

An electronic device operates by using a voltage received from an external power source or a voltage supplied from a battery. In general, a portable electronic device converts the voltage from the battery and supplies the converted voltage to an internal circuit(s). The internal circuit operates by using the converted voltage.

As electronic devices are small-sized and the portability of the electronic device is emphasized, technologies for reducing power consumption of an electronic device are required. In this regard, a dynamic voltage frequency scaling (DVFS) technology is used to reduce power consumption by changing an operating mode of an electronic device depending on a workload of an internal circuit of the electronic device. A magnitude of a voltage which is supplied to the internal circuit is changed according to the operating mode of the electronic device.

In the case where the magnitude of the voltage supplied to the internal circuit changes, the internal circuit may instantaneously malfunction. Accordingly, it is important to supply a stable voltage to the internal circuit.

SUMMARY

Embodiments of the disclosure provide an electronic device which receives a plurality of voltages and outputs a stable voltage.

According to an exemplary embodiment, an electronic circuit may include a first voltage output circuit, a second voltage output circuit, and a voltage detector circuit. Based on a first signal, the first voltage output circuit may output a first output voltage which is based on a first voltage or may not output the first output voltage. Based on a second signal, the second voltage output circuit may output a second output voltage which is based on a second voltage or may not output the second output voltage. When a level of the first voltage is lower than a reference level, the voltage detector circuit may output the first signal such that the first voltage output circuit does not output the first output voltage and may output the second signal such that the second voltage output circuit outputs the second output voltage. The second voltage output circuit may output the second output voltage such that the second output voltage has a level of the first output voltage corresponding to the case where the level of the first voltage is the reference level.

According to an exemplary embodiment, an electronic circuit may include a first voltage output circuit and a second voltage output circuit. The first voltage output circuit may output a first output voltage to an output voltage line based on a first voltage when a level of an output voltage of the output voltage line is higher than a first reference level, and may not output the first output voltage when the level of the output voltage is lower than the first reference level. The second voltage output circuit may output a second output voltage having the first reference level to the output voltage line based on a second voltage when the level of the output voltage is lower than the first reference level.

According to an exemplary embodiment, an electronic circuit may include a power source switching circuit and a load circuit. The power source switching circuit may output a first output voltage based on a first voltage when a level of the first voltage is higher than a reference level, and may output a second output voltage based on a second voltage having a higher level than the reference level when the level of the first voltage is lower than the reference level. The load circuit may be supplied with the first output voltage or the second output voltage. The power source switching circuit may operate such that the second output voltage has a minimum level of the first output voltage.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Below, embodiments of the disclosure may be described in detail and clearly to such an extent that an ordinary one in the art easily implements the disclosure.

Figure 1:
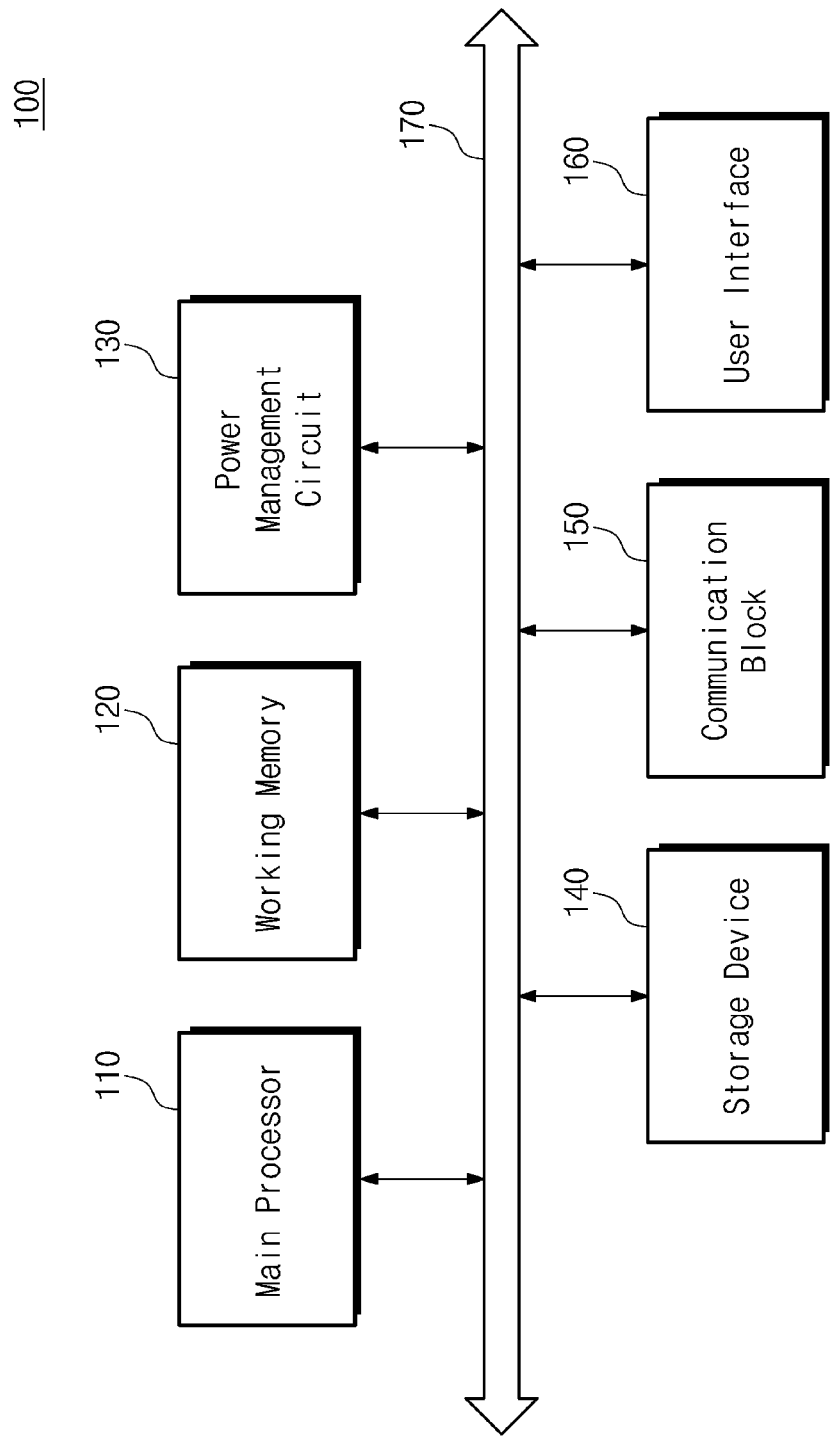
FIG. 1 is a block diagram illustrating an exemplary configuration of an electronic system including a power management circuit according to some embodiments.

FIG. 1 is a block diagram illustrating an exemplary configuration of an electronic system 100 including a power management circuit 130 according to some embodiments.

The electronic system 100 may include a main processor 110, a working memory 120, a storage device 140, a communication block 150, a user interface 160, the power management circuit 130, and a bus 170. For example, the electronic system 100 may be one of electronic devices such as a desktop computer, a laptop computer, a tablet computer, a smartphone, a wearable device, a video game console, a server, an electric vehicle, home appliances, etc.

The main processor 110 may control overall operations of the electronic system 100, and may perform various arithmetic/logical operations. For example, the main processor 110 may be implemented with a general-purpose processor, a special-purpose processor, or an application processor which includes one or more processor cores.

The working memory 120 may store data to be used for an operation of the electronic system 100. For example, the working memory 120 may temporarily store data which are processed or will be processed by the main processor 110. For example, the working memory 120 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM).

The storage device 140 may store data. For example, the storage device 140 may include a nonvolatile memory such as a flash memory, a PRAM, an MRAM, a ReRAM, or an FRAM. For example, the storage device 140 may include a storage medium such as a solid state drive (SSD), card storage, or embedded storage.

The communication block 150 may support at least one of various wireless/wired communication protocols for the purpose of communicating with an external device/system of the electronic system 100. The user interface 160 may include various input/output interfaces for the purpose of arbitrating communication between a user and the electronic system 100.

The power management circuit 130 may power components of the electronic system 100. The power management circuit 130 may receive power from an external power source and/or a battery. The power management circuit 130 may appropriately convert the received power and may output the converted power for the components of the electronic system 100.

The bus 170 may provide a communication path between the components of the electronic system 100. The components of the electronic system 100 may exchange data with each other in compliance with a bus format of the bus 170. For example, the bus format may include one or more of various interface protocols such as universal serial bus (USB), small computer system interface (SCSI), peripheral component interconnect express (PCIe), mobile PCIe (M-PCIe), serial advanced technology attachment (SATA), serial attached SCSI (SAS), nonvolatile memory express (NVMe), universal flash storage (UFS), double data rate (DDR), and low power DDR (LPDDR).

The power management circuit 130 may be implemented according to embodiments of the present disclosure. The power management circuit 130 may supply a voltage stably to the components of the electronic system 100 even in the case where a level of a voltage received from the external power source and/or the battery is changed. Exemplary configurations and operations associated with the power management circuit 130 will be described with reference to FIGS. 2 to 19.

The power management circuit 130 may be provided in the following descriptions. However, the present disclosure is not limited thereto. The embodiments may be adopted to any type of device including a semiconductor element (or device). For example, the embodiments may be adopted for a memory included in the working memory 120. The following descriptions are provided for better understanding, not intended to limit the disclosure.

Figure 2:
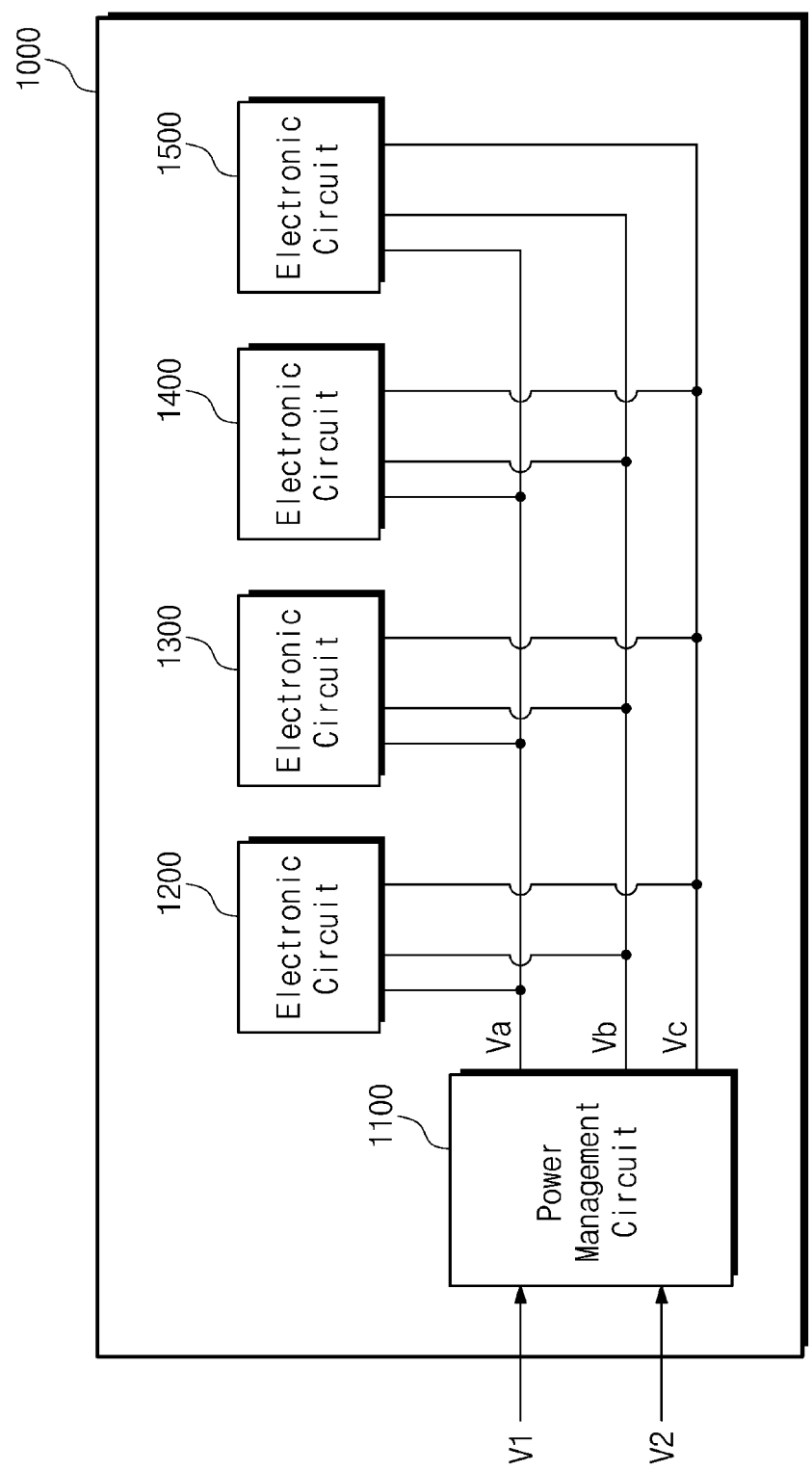
FIG. 2 is a block diagram illustrating an exemplary configuration of an electronic device including a power management circuit according to some embodiments.

FIG. 2 is a block diagram illustrating an exemplary configuration of an electronic device 1000 including a power management circuit 1100 according to some embodiments.

The electronic device 1000 may include a power management circuit 1100 and electronic circuits 1200, 1300, 1400, and 1500. For example, the electronic device 1000 may correspond to a memory module such as a single in-line memory module (SIMM), a dual in-line memory module (DIMM), a Rambus in-line memory module (RIMM), etc. In particular, in the case where the electronic device 1000 is included in fifth generation DDR (DDR5) DIMM, the power management circuit 1100 may be included in a power management integrated circuit (PMIC) mounted on the DDR5 DIMM. In this case, each of electronic circuits 1200, 1300, 1400, and 1500 may be a memory mounted on the DDR5 DIMM, but the disclosure is not limited thereto. For example, the electronic circuits 1200, 1300, 1400, and 1500 may be included in the components 110, 120, 140, 150, and 160 of FIG. 1.

The power management circuit 1100 may receive voltages V1 and V2 from an external power source and/or a battery. The power management circuit 1100 may appropriately convert the received voltages V1 and V2 and may output voltages Va, Vb, and Vc. The voltages Va, Vb, and Vc may be supplied to the electronic circuits 1200, 1300, 1400, and 1500.

The electronic circuits 1200, 1300, 1400, and 1500 may be driven based on the voltages Va, Vb, and Vc. For example, in the case where the electronic circuits 1200, 1300, 1400, and 1500 are circuits included in a memory, the voltages Va, Vb, and Vc may be, but are not limited to, a core voltage VDD, a pump voltage VPP, and a word line voltage VDDQ.

An operating mode of the electronic device 1000 may be changed according to a workload of the electronic circuits 1200, 1300, 1400, and 1500. Levels of the voltages Va, Vb, and Vc required to drive the electronic circuits 1200, 1300, 1400, and 1500 may be changed according to the operating mode. Accordingly, levels of the voltages V1 and V2 input to the power management circuit 1100 may also be changed. The case where the level of the voltages V1 and V2 are changed will be described in connection with the case where the operating mode of the electronic device 1000 is changed, but this is only for convenience of description, not intended to limit the disclosure. The power management circuit 1100 may be implemented at a system and/or a device which is driven by using a plurality of voltages received from an external power source and/or a battery.

Figure 3:
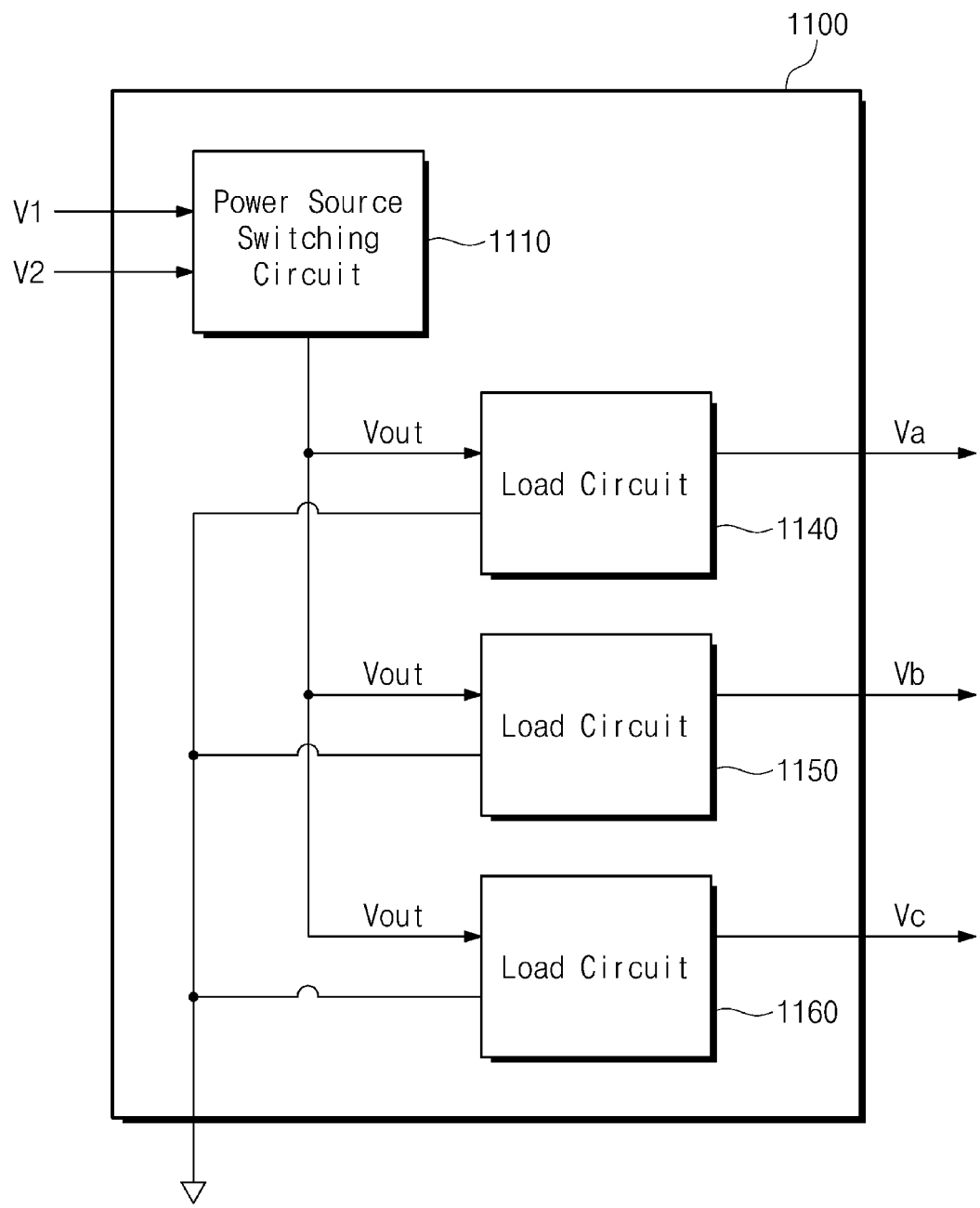
FIG. 3 is a block diagram illustrating an exemplary configuration of a power management circuit of FIG. 2.

FIG. 3 is a block diagram illustrating an exemplary configuration of the power management circuit 1100 of FIG. 2.

The power management circuit 1100 may include a power source switching circuit 1110 and load circuits 1140, 1150, and 1160.

The power source switching circuit 1110 may receive the voltages V1 and V2 from an external power source and/or a battery. The power source switching circuit 1110 may output a voltage Vout based on the received voltages V1 and V2. A level of the voltage Vout may be changed according to the levels of the voltages V1 and V2.

The load circuits 1140, 1150, and 1160 may receive the voltage Vout from the power source switching circuit 1110. The load circuits 1140, 1150, and 1160 may output the voltages Va, Vb, and Vc based on the received voltage Vout. For example, the voltages Va, Vb, and Vc may be supplied to the electronic circuits 1200, 1300, 1400, and 1500.

Levels of the voltages V1 and V2 input to the power management circuit 1100 may be changed according to the operating mode of the electronic device 1000. For example, in a normal mode, the voltages V1 and V2 may have fixed levels, and the level of the voltage V2 may be higher than the level of the voltage V1. In this case, the power source switching circuit 1110 may output the voltage Vout based on the voltage V1.

For another example, in a low-power mode, the level of the voltage V1 may decrease, and the voltage V2 may have the fixed level. In the case where the level of the voltage V1 is lower than a reference level, the power source switching circuit 1110 may output the voltage Vout based on the voltage V2 instead of the voltage V1.

For another example, in the case where the operating mode of the electronic device 1000 is changed from the low-power mode to the normal mode, the level of the voltage V1 in the low-power mode may increase to the level of the voltage V1 in the normal mode again. The voltage V2 may have the fixed level which is identical to that in the low-power mode. In the case where the level of the voltage V1 is higher than the reference level, the power source switching circuit 1110 may output the voltage Vout based on the voltage V1 instead of the voltage V2.

In the following descriptions, it is assumed that the level of the voltage V1 decreases and then increases and the voltage V2 has the fixed level, but the disclosure is not limited thereto. The level of the voltage V1 may increase and then may decrease, or may be maintained uniformly. The level of the voltage V2 may also increase or decrease.

The level of the voltage Vout may sharply change in a time interval when the power source switching circuit 1110 switches a power source supplying the voltage Vout from the voltage V1 to the voltage V2 or in a time interval when the power source switching circuit 1110 switches the power source supplying the voltage Vout from the voltage V2 to the voltage V1. In the case where the level of the voltage Vout sharply changes, the load circuits 1140, 1150, and 1160 may instantaneously fail to function properly.

Figure 4:
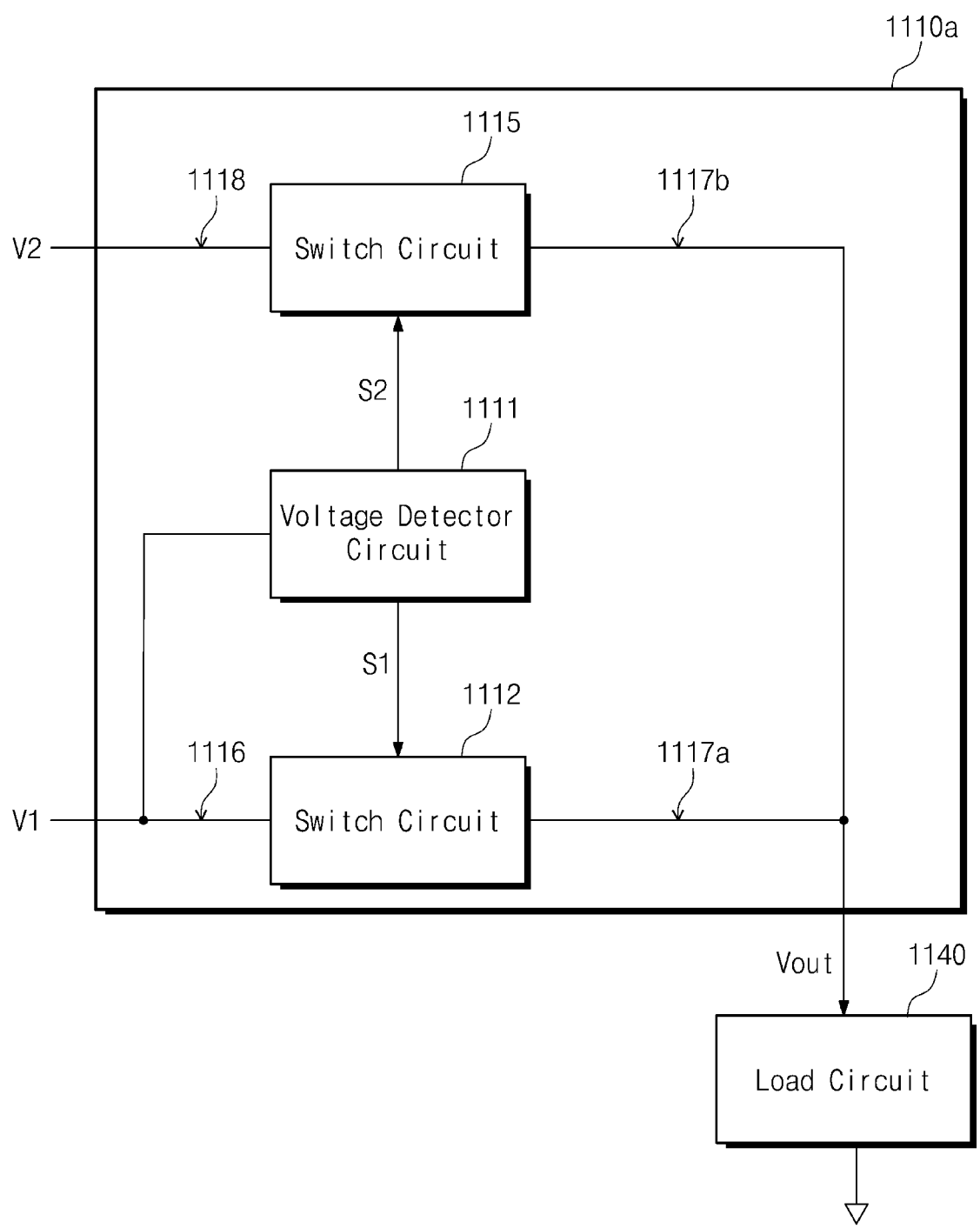
FIG. 4 is a block diagram illustrating an exemplary configuration of a power source switching circuit of FIG. 3.

FIG. 4 is a block diagram illustrating an exemplary configuration of the power source switching circuit 1110 of FIG. 3.

In some embodiments, the power source switching circuit 1110 of FIG. 3 may include a power source switching circuit 1110a of FIG. 4. The power source switching circuit 1110a may include a voltage detector circuit 1111 and switch circuits 1112 and 1115.

The voltage detector circuit 1111 may receive the voltage V1 from a power line 1116. The voltage detector circuit 1111 may compare a level of the received voltage V1 and the reference level. The voltage detector circuit 1111 may output signals S1 and S2 based on a result of comparing the level of the received voltage V1 and the reference level.

The voltage detector circuit 1111 may output the signals S1 and S2 selectively having a value of logic "0" or a value of logic "1", based on the result of comparing the level of the voltage V1 and a reference level Lv0. Each of the signals S1 and S2 may selectively have one of voltage levels d0 and d1 corresponding to logical values "0" and "1". For example, the signals S1 and S2 having a value of logic "1" may have the voltage level d1. The signals S1 and S2 having a value of logic "0" may have the voltage level d0.

The switch circuit 1112 may receive the signal S1 from the voltage detector circuit 1111. Based on the signal S1 and the voltage V1, the switch circuit 1112 may output a first output voltage to a voltage line 1117a or may not output the first output voltage to the voltage line 1117a.

For example, the switch circuit 1112 may output the first output voltage from the voltage V1 in the case where the signal S1 having the voltage level d1 is received. For another example, the switch circuit 1112 may not output the first output voltage in the case where the signal S1 having the voltage level d0 is received. In the case where the first output voltage is output, the voltage Vout output to the load circuit 1140 may be the first output voltage. That is, a power source which supplies the voltage Vout may be the voltage V1.

The switch circuit 1115 may receive the signal S2 from the voltage detector circuit 1111. Based on the signal S2 and the voltage V2, the switch circuit 1115 may output a second output voltage to a voltage line 1117b or may not output the second output voltage to the voltage line 1117b.

For example, the switch circuit 1115 may output the second output voltage from the voltage V2 in the case where the signal S2 having the voltage level d1 is received. In the case where the second output voltage is output, the voltage Vout output to the load circuit 1140 may be the second output voltage. That is, a power source which supplies the voltage Vout may be the voltage V2. For another example, the switch circuit 1115 may not output the second output voltage in the case where the signal S2 having the voltage level d0 is received.

Figure 5:
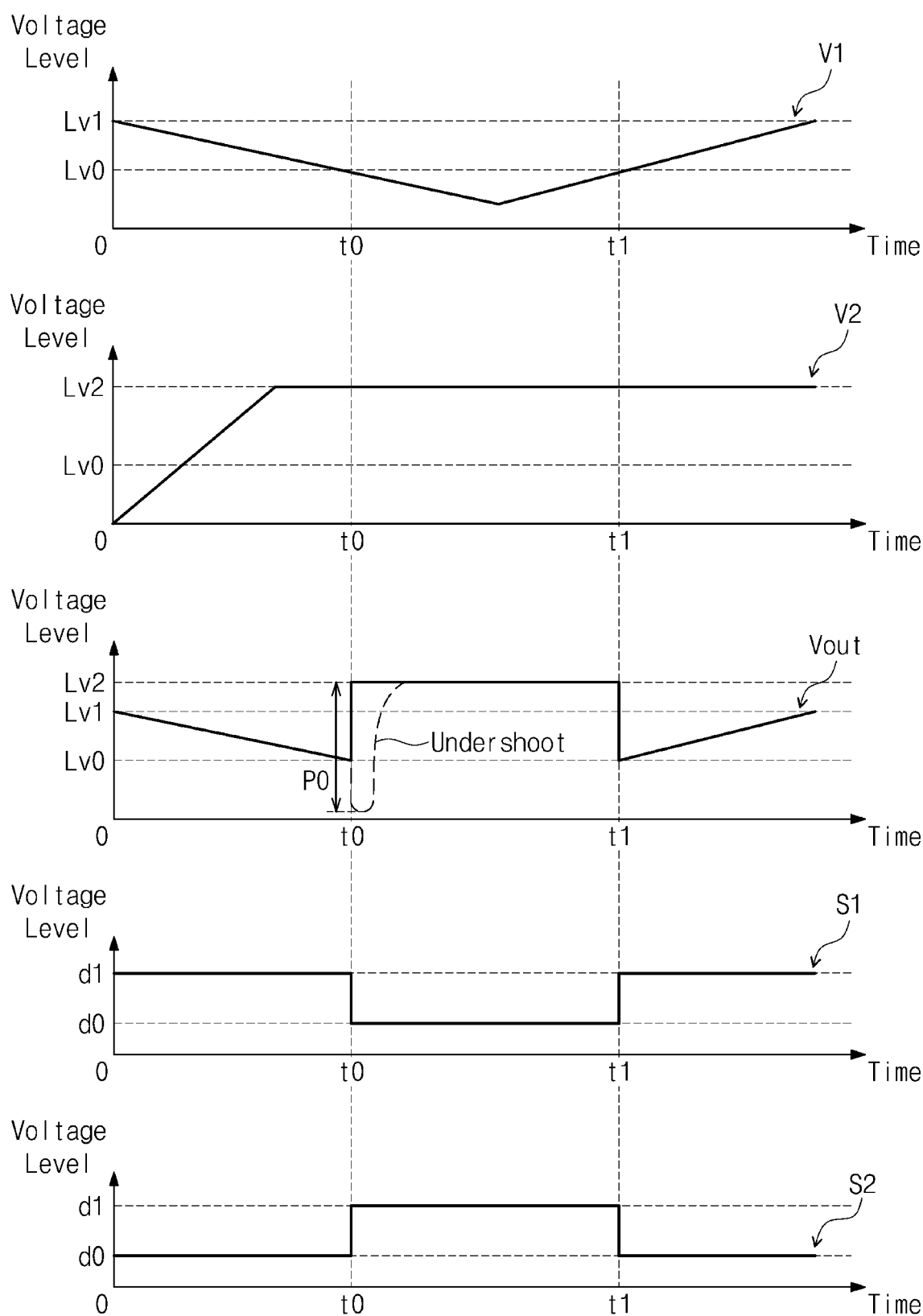
FIG. 5 is a graph illustrating a level of a voltage output from a power source switching circuit based on voltages and waveforms of signals.

FIG. 5 is a graph illustrating a level of the voltage Vout output from a power source switching circuit 1110a based on the voltage V1 and the voltage V2 and waveforms of the signals S1 and S2. How the power source switching circuit 1110a operates as a level of the voltage V1 changes will be described with reference to FIG. 5. For better understanding, FIG. 4 will be referenced together to explain FIG. 5. In the following descriptions, it is assumed that the reference level Lv0 is lower than a fixed level Lv2 of the voltage V2.

In a time interval from a time "0" to a time "t0", the voltage V1 may decrease from a level Lv1 to the reference level Lv0. The voltage V2 may be maintained at a level Lv2 after being increased from the level of 0 V to the level Lv2.

When a level of the voltage V1 is the reference level Lv0 or higher (or exceeds the reference level Lv0), the voltage detector circuit 1111 may output the signal S1 having a value of logic "1" or the voltage level d1. In this case, the voltage detector circuit 1111 may output the signal S2 having a value of logic "0" or the voltage level d0. In the following descriptions, the signals S1 and S2 having a value of logic "1" or the voltage level d1 are expressed by signals S1_d1 and S2_d1, and the signals S1 and S2 having a value of logic "0" or the voltage level d0 are expressed by signals S1_d0 and S2_d0.

The switch circuit 1112 may receive the signal S1_d1 from the voltage detector circuit 1111. The switch circuit 1112 may output the first output voltage from the voltage V1, based on the signal S1_d1. The switch circuit 1115 may receive the signal S2_d0 from the voltage detector circuit 1111. The switch circuit 1115 may not output the second output voltage based on the signal S2_d0. In this case, the voltage Vout may be the first output voltage, and may have the level of the voltage V1.

In a time interval from the time "t0" to a time "t1", the voltage V1 may decrease and then increase between the level Lv0 and the level "0". The voltage V2 may be maintained at the level Lv2.

When the level of the voltage V1 is lower (or not higher) than the reference level Lv0, the voltage detector circuit 1111 may output the signals S1_d0 and S2_d1.

The switch circuit 1112 may receive the signal S1_d0 from the voltage detector circuit 1111. The switch circuit 1112 may not output the first output voltage based on the signal S1_d0. The switch circuit 1115 may receive the signal S2_d1 from the voltage detector circuit 1111. The switch circuit 1115 may output the second output voltage from the voltage V2, based on the signal S2_d1. In this case, the voltage Vout may be the second output voltage, and may have the level of the voltage V2. That is, the level of the voltage Vout may be the level Lv2.

At a time (e.g., t0) at which the power source switching circuit 1110a switches a power source supplying the voltage Vout from the voltage V1 to the voltage V2, the switch circuit 1112 may disconnect the power line 1116 from the first output line 1117a. The switch circuit 1115 may connect a power line 1118 to the second output line 1117b. A current may not flow to the load circuit 1140 instantaneously by a switching operation of the switch circuits 1112 and 1115. As such, the level of the voltage Vout may sharply change. Referring to a waveform graph of the voltage Vout, at the time (e.g., t0) at which the power source switching circuit 1110a switches a power source supplying the voltage Vout from the voltage V1 to the voltage V2, undershooting (expressed by a dotted line) may occur.

From the time "t1", the voltage V1 may have a level higher than the reference level Lv0 again. The voltage V2 may be maintained at the level Lv2. From a time "t1" at which the level of the voltage V1 is higher than the reference level Lv0, the voltage detector circuit 1111 and the switch circuits 1112 and 1115 may provide operations which are substantially identical to the operations between the time "0" and the time "t0". Thus, additional description will be omitted to avoid redundancy.

However, the disclosure is not limited thereto. For example, when the level of the voltage V1 is the reference level Lv0 or higher (or exceeds the reference level Lv0), the voltage detector circuit 1111 may output the signals S1_d1 and S2_d0. When the level of the voltage V1 is lower (or not higher) than the reference level Lv0, the voltage detector circuit 1111 may output the signals S1_d0 and S2_d1. In this case, the switch circuit 1112 may output the first output voltage in the case where the signal S1_d0 is received and may not output the first output voltage in the case where the signal S1_d1 is received. Likewise, the switch circuit 1115 may output the second output voltage in the case where the signal S2_d0 is received and may not output the second output voltage in the case where the signal S2_d1 is received.

Figure 6:
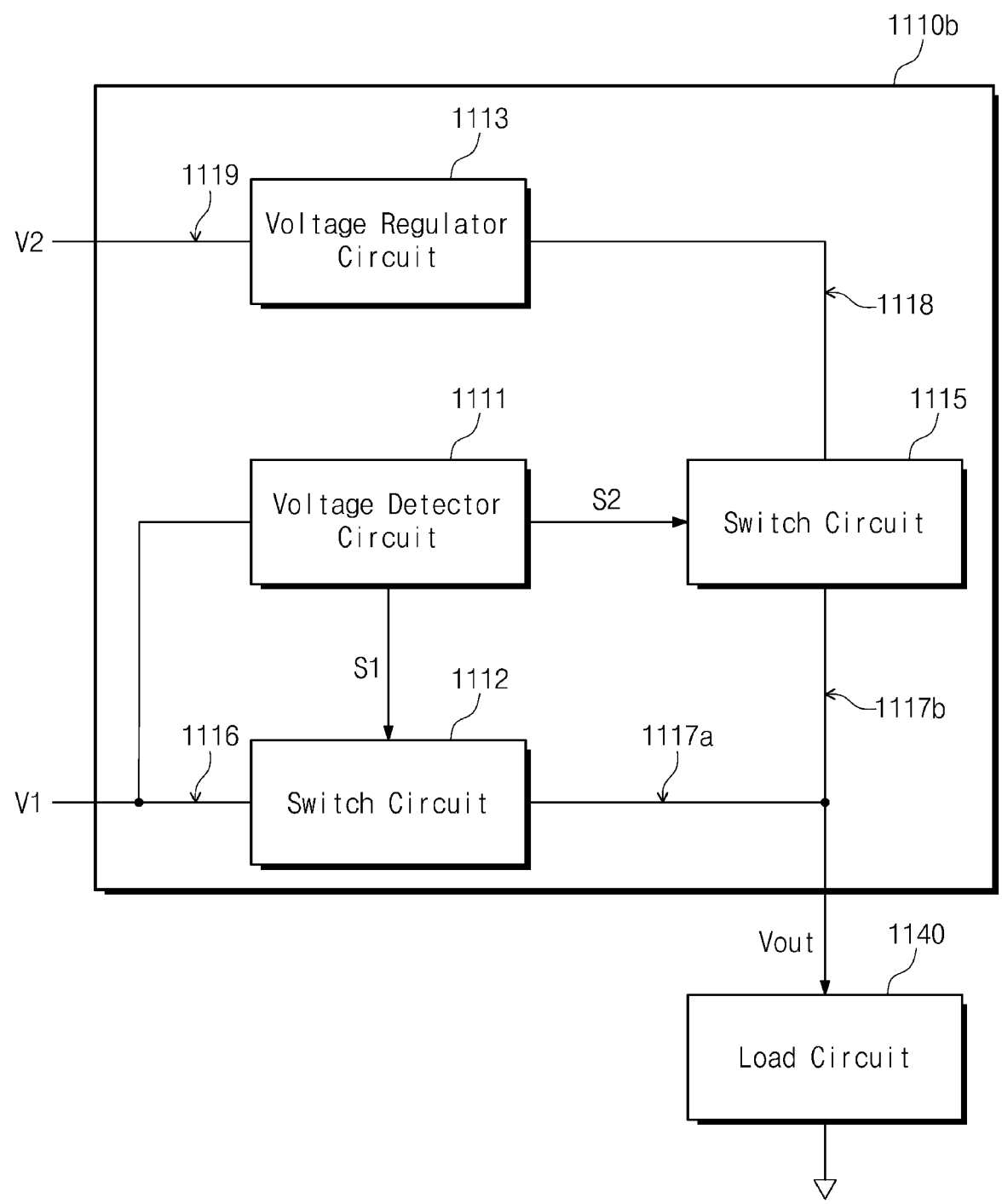
FIG. 6 is a block diagram illustrating an exemplary configuration of a power source switching circuit of FIG. 3.

FIG. 6 is a block diagram illustrating an exemplary configuration of the power source switching circuit 1110 of FIG. 3.

In some embodiments, the power source switching circuit 1110 of FIG. 3 may include a power source switching circuit 1110b of FIG. 6. Components 1111, 1112, and 1115 of the power source switching circuit 1110b illustrated in FIG. 6 may provide operations which are substantially identical of the operations of the components 1111, 1112, and 1115 of the power source switching circuit 1110a. The power source switching circuit 1110b may be different from the power source switching circuit 1110a in that the power source switching circuit 1110b further includes a voltage regulator circuit 1113.

The voltage regulator circuit 1113 may receive the voltage V2 from a power line 1119. The voltage regulator circuit 1113 may regulate a level of the received voltage V2 and may output the second output voltage to a power line 1118. The voltage regulator circuit 1113 may regulate the level of the second output voltage so as to be lower than the level of the received voltage V2. For example, the voltage regulator circuit 1113 may regulate the level of the second output voltage to the reference level Lv0.

However, the configuration of the power source switching circuit 1110b illustrated in FIG. 6 is only for convenience of description, and the power source switching circuit 1110b may be configured to include a voltage output circuit outputting a voltage. For example, the voltage output circuit may include the switch circuit 1112 outputting the first output voltage. The voltage output circuit including the switch circuit 1112 may further include the voltage detector circuit 1111. For another example, the voltage output circuit may include the switch circuit 1115 outputting the second output voltage. The voltage output circuit including the switch circuit 1115 may further include the voltage regulator circuit 1113.

An operation of a power source switching circuit including a voltage regulator circuit will be more fully described with reference to FIGS. 7 to 19.

Figure 7:
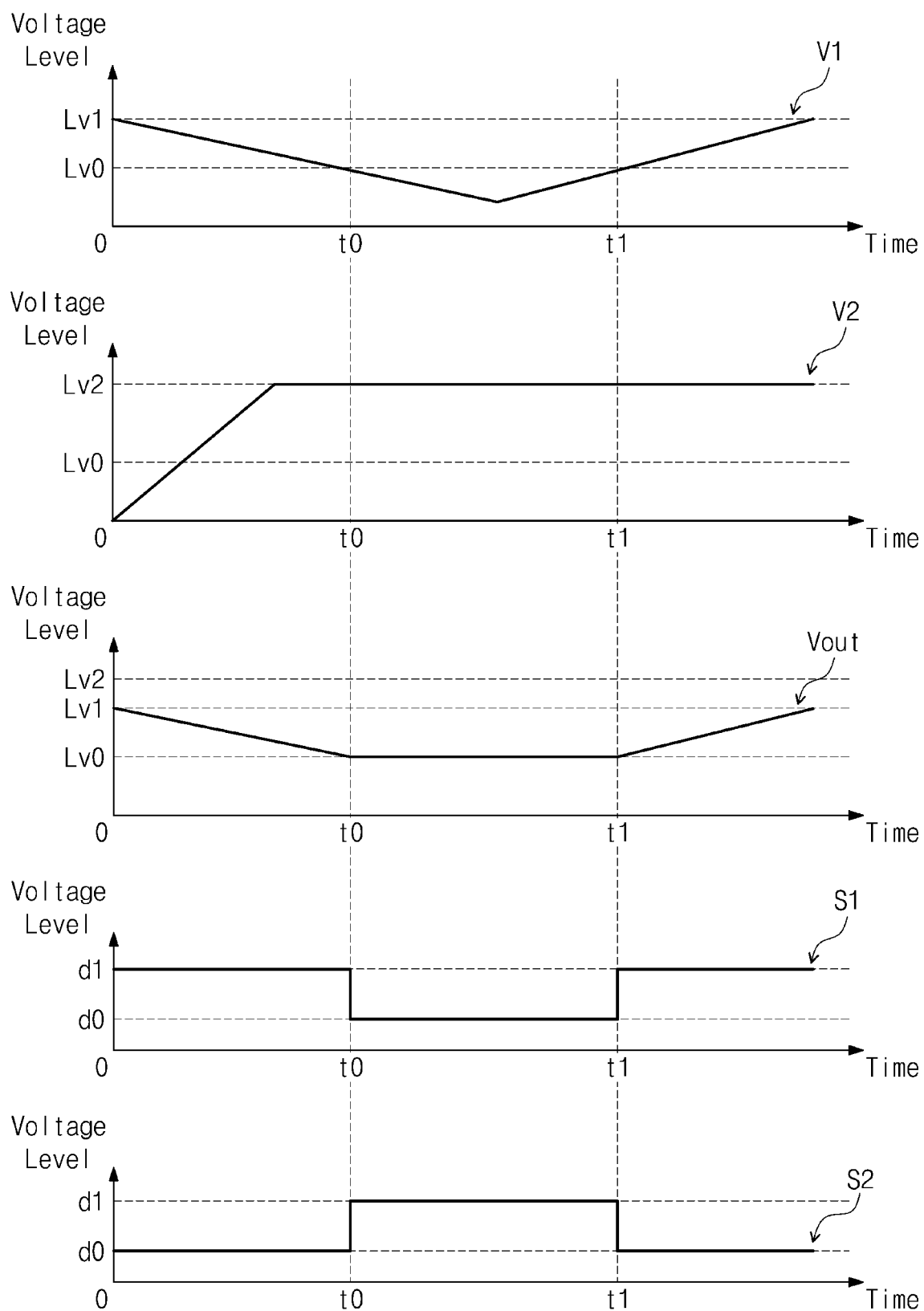
FIG. 7 is a graph illustrating a level of a voltage output from a power source switching circuit of FIG. 6 based on voltages and waveforms of signals.

FIG. 7 is a graph illustrating a level of the voltage Vout output from a power source switching circuit 1110b of FIG. 6 based on the voltages V1 and V2 and waveforms of the signals S1 and S2. A description will be mainly focused on a difference between graphs illustrated in FIG. 7 and graphs illustrated in FIG. 5, and additional description will be omitted to avoid redundancy.

In a time interval from a time "t0" to a time "t1", the voltage V1 may decrease and increase between the level Lv0 and the level "0". The voltage V2 may be maintained at the level Lv2. As described with reference to FIG. 5, when a level of the voltage V1 is lower than the reference level Lv0, the voltage detector circuit 1111 may output the signals S1_d0 and S2_d1.

The switch circuit 1112 may not output the first output voltage based on the signal S1_d0. The switch circuit 1115 may output the second output voltage from the voltage V2, based on the signal S2_d1. In this case, unlike the description given with reference to FIG. 5, the voltage Vout may have the reference level Lv0 lower than the level Lv2. Accordingly, the power source switching circuit 1110b according to an embodiment of the disclosure may output a stable voltage Vout even at a time (e.g., t0) at which a power source supplying the voltage Vout is switched from the voltage V1 to the voltage V2 and at a time (e.g., t1) at which a power source supplying the voltage Vout is switched from the voltage V2 to the voltage V1. That is, the power source switching circuit 1110b may reduce a change in the level of the voltage Vout, which is made the times (e.g., t0 and t1) at which the power source supplying the voltage Vout is switched. Accordingly, an abnormal operation of the load circuits 1140, 1150, and 1160 may decrease.

In the following descriptions, it is assumed that no voltage drop occurs within components of a power source switching circuit or on voltage lines of the power source switching circuit. Accordingly, in the case where the voltage V1 has the reference level Lv0, the level of the first output voltage and the level of the voltage Vout which is based on the first output voltage may be the reference level Lv0. For example, the voltage regulator circuit 1113 may regulate the level of the second output voltage to the reference level Lv0.

However, the disclosure is not limited thereto. For example, the voltage regulator circuit 1113 may regulate the level of the second output voltage to the level of the first output voltage in the case where the level of the voltage V1 is the reference level Lv0. For another example, the voltage regulator circuit 1113 may regulate the level of the second output voltage to the level of the voltage Vout in the case where the level of the voltage V1 is the reference level Lv0. For another example, the voltage regulator circuit 1113 may regulate the level of the second output voltage such that the voltage Vout between the time "t0" and the time "t1" has a level of the voltage Vout corresponding to the time (e.g., t0) at which a power source supplying the voltage Vout is changed from the voltage V1 to the voltage V2. For another example, the voltage regulator circuit 1113 may regulate the level of the second output voltage such that the voltage Vout between the time "t0" and the time "t1" has a minimum level of the voltage Vout corresponding to the time at which a power source supplying the voltage Vout is the voltage V1.

Figure 8:
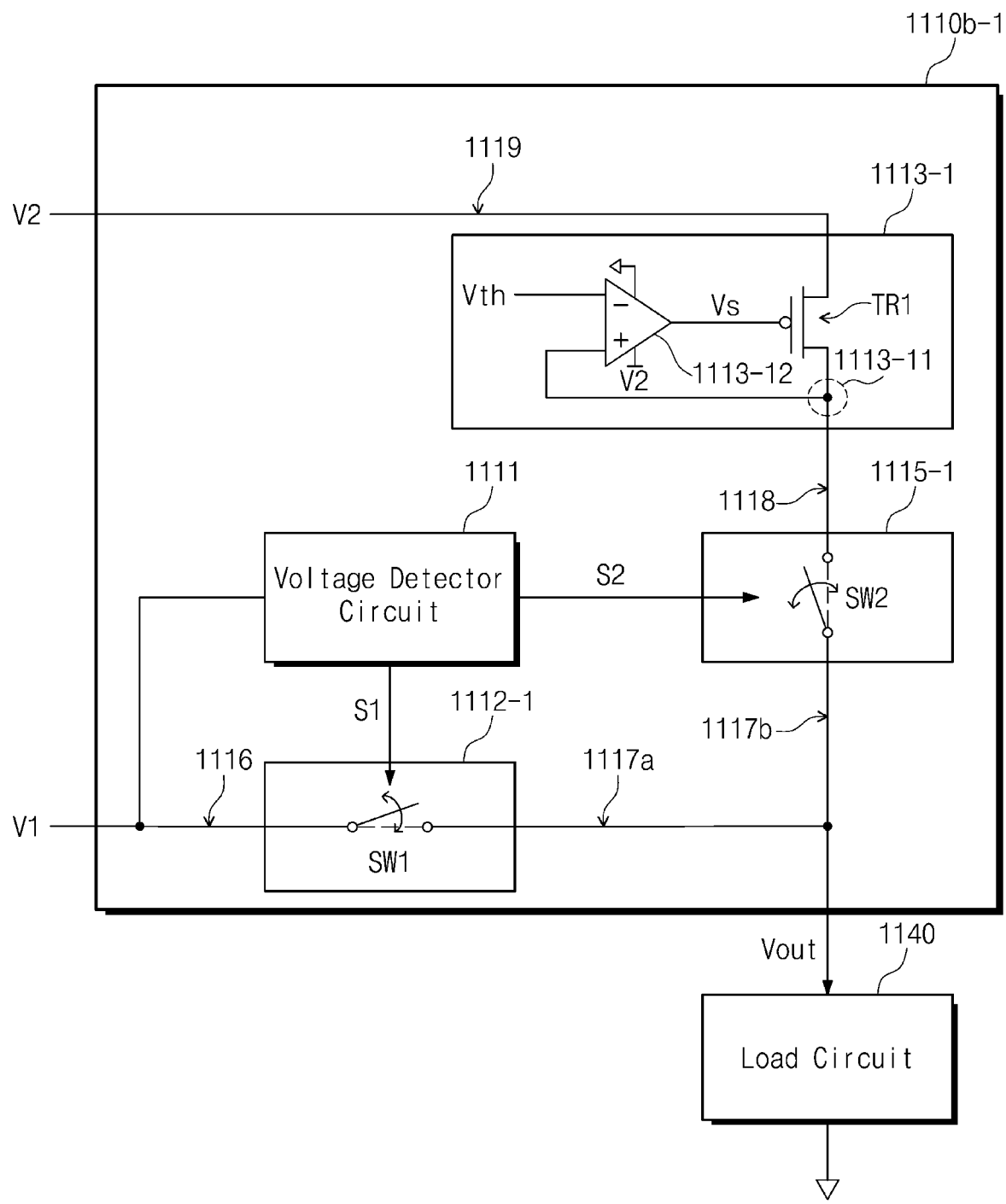
FIG. 8 is a block diagram illustrating an exemplary configuration of a power source switching circuit of FIG. 6.

FIG. 8 is a block diagram illustrating an exemplary configuration of the power source switching circuit 1110b of FIG. 6.

In some embodiments, the power source switching circuit 1110b of FIG. 6 may include a power source switching circuit 1110b-1 of FIG. 8. Components 1111, 1112-1, 1113-1, and 1115-1 of the power source switching circuit 1110b-1 illustrated in FIG. 8 may provide operations which are substantially identical of the operations of the components 1111, 1112, 1113, and 1115 of the power source switching circuit 1110b illustrated in FIG. 6. A detailed configuration of the components 1112-1, 1113-1, and 1115-1 is illustrated in FIG. 8.

Based on the signal S1, the switch circuit 1112-1 may output or may not output the first output voltage to the voltage line 1117a. For example, a switch SW1 included in the switch circuit 1112-1 may be implemented with a device for opening and closing voltage lines. The switch SW1 may connect the voltage line 1116 to the voltage line 1117a when the signal S1_d1 is received. The switch SW1 may disconnect the voltage line 1116 from the voltage line 1117a when the signal S1_d0 is received. However, the disclosure is not limited thereto. For example, the switch circuit 1112-1 may be implemented with a transistor such as a bipolar junction transistor (BJT) or a metal-oxide-semiconductor field effect transistor (MOSFET).

The voltage regulator circuit 1113-1 may include an amplifier 1113-12 and a transistor TR1. For example, the transistor TR1 may be a PMOS transistor. The voltage regulator circuit 1113-1 may receive the voltage V2 from the power line 1119. The voltage regulator circuit 1113-1 may regulate a level of the received voltage V2 and may output the second output voltage having the regulated level to the power line 1118.

As described with reference to FIG. 7, the power source switching circuit 1110b-1 may regulate the level of the second output voltage to the reference level Lv0. The power source switching circuit 1110b-1 may receive a voltage Vth having the reference level Lv0 for the purpose of regulating the level of the second output voltage to the reference level Lv0.

The amplifier 1113-12 may receive the voltage V2 and a ground voltage through a first power terminal and a second power terminal. The amplifier 1113-12 may receive the second output voltage from a feedback voltage line and the voltage Vth. The feedback voltage line may be connected to a node 1113-11 positioned on the voltage line 1118. The amplifier 1113-12 may receive the voltage Vth and the second output voltage through an inverting terminal and a non-inverting terminal, respectively.

The amplifier 1113-12 may amplify a difference between the level Lv0 of the voltage Vth and the level of the second output voltage and may output a voltage Vs. A level of the voltage Vs may change by the difference between the level Lv0 of the voltage Vth and the level of the second output voltage.

The transistor TR1 may receive the voltage V2 from the voltage line 1119 and may output the second output voltage to the voltage line 1118. The transistor TR1 may receive the voltage Vs through a control terminal. Depending on the level of the voltage Vs input to the transistor TR1, a current may flow or may not flow through the transistor TR1.

When the level of the second output voltage is lower than the level Lv0, the voltage Vs having a first level may be output. When the voltage Vs having the first level is input to the transistor TR1, a current may flow from the voltage line 1119 to the voltage line 1118 through the transistor TR1. For example, the first level may be a level (e.g., 0 V) of the ground voltage input to the second power terminal.

When the level of the second output voltage is higher than the level Lv0, the voltage Vs having a second level may be output. When the voltage Vs having the second level is input to the transistor TR1, a current may not flow through the transistor TR1. For example, the second level may be the level Lv2 of the voltage V2 input to the first power terminal.

That is, in the case where the level of the second output voltage is lower than the level Lv0 of the voltage Vth, by the amplifier 1113-12 and the transistor TR1, a current may flow from the voltage line 1119 to the voltage line 1118. Accordingly, the level of the second output voltage may increase. In the case where the level of the second output voltage is higher than the level Lv0 of the voltage Vth, by the amplifier 1113-12 and the transistor TR1, a current may not flow from the voltage line 1119 to the voltage line 1118. In the case where the level of the second output voltage is again lower than the level Lv0 of the voltage Vth, the amplifier 1113-12 and the transistor TR1 may repeat the above operation such that the level of the second output voltage is regulated to the level Lv0 of the voltage Vth.

Based on the signal S2, the switch circuit 1115-1 may output or may not output the second output voltage to the voltage line 1117b. For example, a switch SW2 included in the switch circuit 1115-1 may be implemented with a device for opening and closing voltage lines. The switch SW2 may connect the voltage line 1118 to the voltage line 1117b when the signal S2_d1 is received. The switch SW2 may disconnect the voltage line 1118 from the voltage line 1117b when the signal S2_d0 is received. However, the disclosure is not limited thereto. For example, the switch circuit 1115-1 may be implemented with a transistor such as a BJT or an MOSFET.

Figure 9:
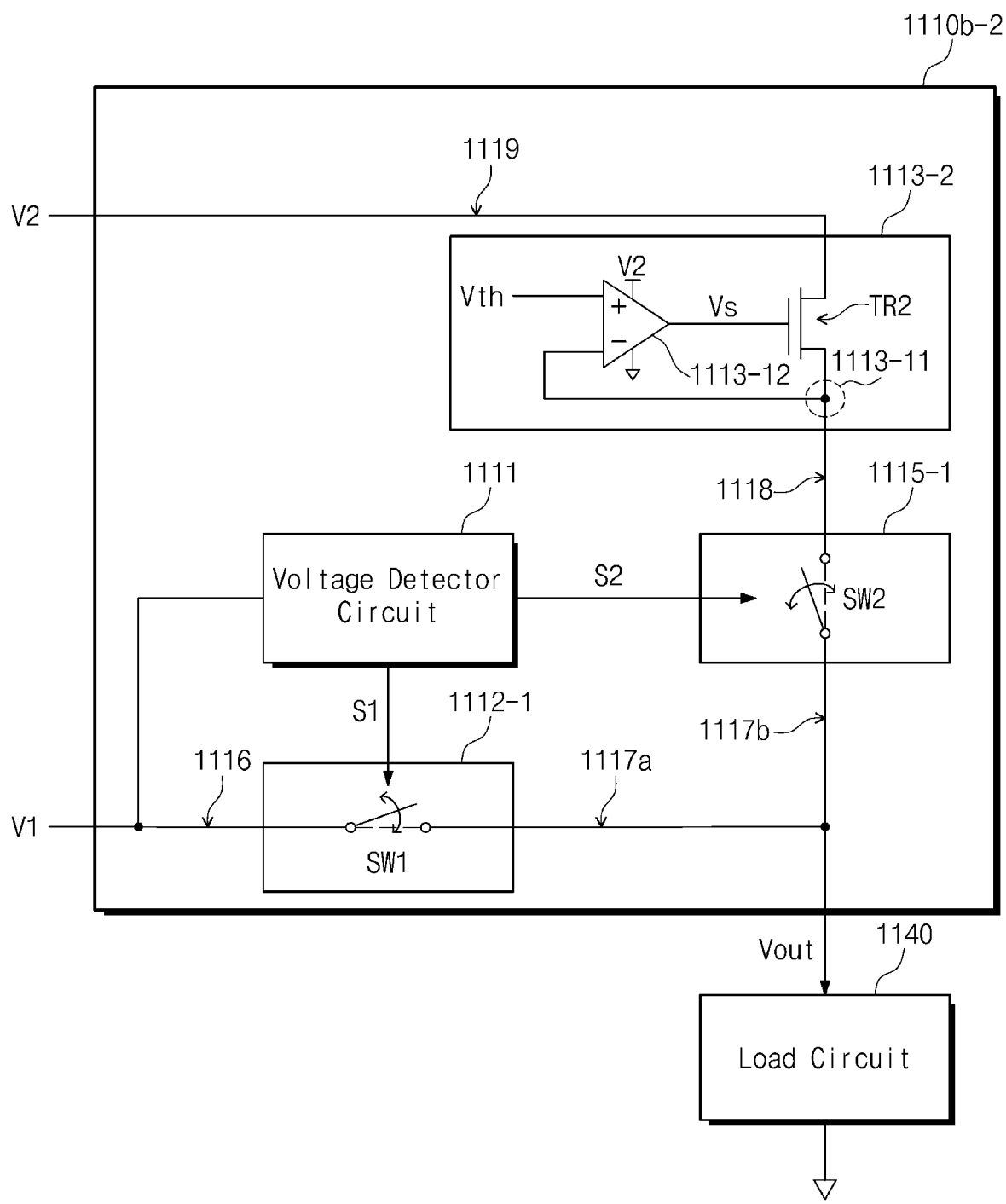
FIG. 9 is a block diagram illustrating an exemplary configuration of a power source switching circuit of FIG. 6.

FIG. 9 is a block diagram illustrating an exemplary configuration of the power source switching circuit 1110*b* of FIG. 6.

In some embodiments, the power source switching circuit 1110*b* of FIG. 6 may include a power source switching circuit 1110*b*-2 of FIG. 9. Components 1111, 1112-1, 1113-2, and 1115-1 of the power source switching circuit 1110*b*-2 illustrated in FIG. 9 may provide operations which are substantially identical of the operations of the components 1111, 1113-1, 1112-1, and 1115-1 of the power source switching circuit 1110*b*-1 illustrated in FIG. 8. However, unlike the voltage regulator circuit 1113-1, the voltage regulator circuit 1113-2 may include an NMOS transistor. Below, a description will be mainly focused on a difference between the voltage regulator circuit 1113-2 and the voltage regulator circuit 1113-1, and thus, additional description will be omitted to avoid redundancy.

The voltage regulator circuit 1113-2 may include the amplifier 1113-12 and a transistor TR2. For example, the transistor TR2 may be an NMOS transistor.

The amplifier 1113-12 may receive the voltage V2 and the ground voltage through a first power terminal and a second power terminal. The amplifier 1113-12 may receive the voltage Vth and the second output voltage through a non-inverting terminal and an inverting terminal, respectively.

The amplifier 1113-12 may amplify a difference between the level Lv0 of the voltage Vth and the level of the second output voltage and may output the voltage Vs. A level of the voltage Vs may change by the difference between the level Lv0 of the voltage Vth and the level of the second output voltage.

The transistor TR2 may receive the voltage V2 from the voltage line 1119 and may output the second output voltage to the voltage line 1118. The transistor TR2 may receive the voltage Vs through a control terminal. Depending on the level of the voltage Vs input to the transistor TR2, a current may flow or may not flow through the transistor TR2.

When the level of the second output voltage is lower than the level Lv0, the voltage Vs having a first level may be output. When the voltage Vs having the first level is input to the transistor TR2, a current may flow from the voltage line 1119 to the voltage line 1118 through the transistor TR2. For example, the first level may be the level Lv2 of the voltage V2 input to the first power terminal.

When the level of the second output voltage is higher than the level Lv0, the voltage Vs having a second level may be output. When the voltage Vs having the second level is input to the transistor TR2, a current may not flow through the transistor TR2. For example, the second level may be a level (e.g., 0 V) of the ground voltage input to the second power terminal.

That is, in the case where the level of the second output voltage is lower than the level Lv0 of the voltage Vth, by the amplifier 1113-12 and the transistor TR2, a current may flow from the voltage line 1119 to the voltage line 1118. Accordingly, the level of the second output voltage may increase. In the case where the level of the second output voltage is higher than the level Lv0 of the voltage Vth, by the amplifier 1113-12 and the transistor TR2, a current may not flow from the voltage line 1119 to the voltage line 1118. In the case where the level of the second output voltage is again lower than the level Lv0 of the voltage Vth, the amplifier 1113-12 and the transistor TR2 may repeat the above operation such that the level of the second output voltage is regulated to the level Lv0 of the voltage Vth.

Figure 10:
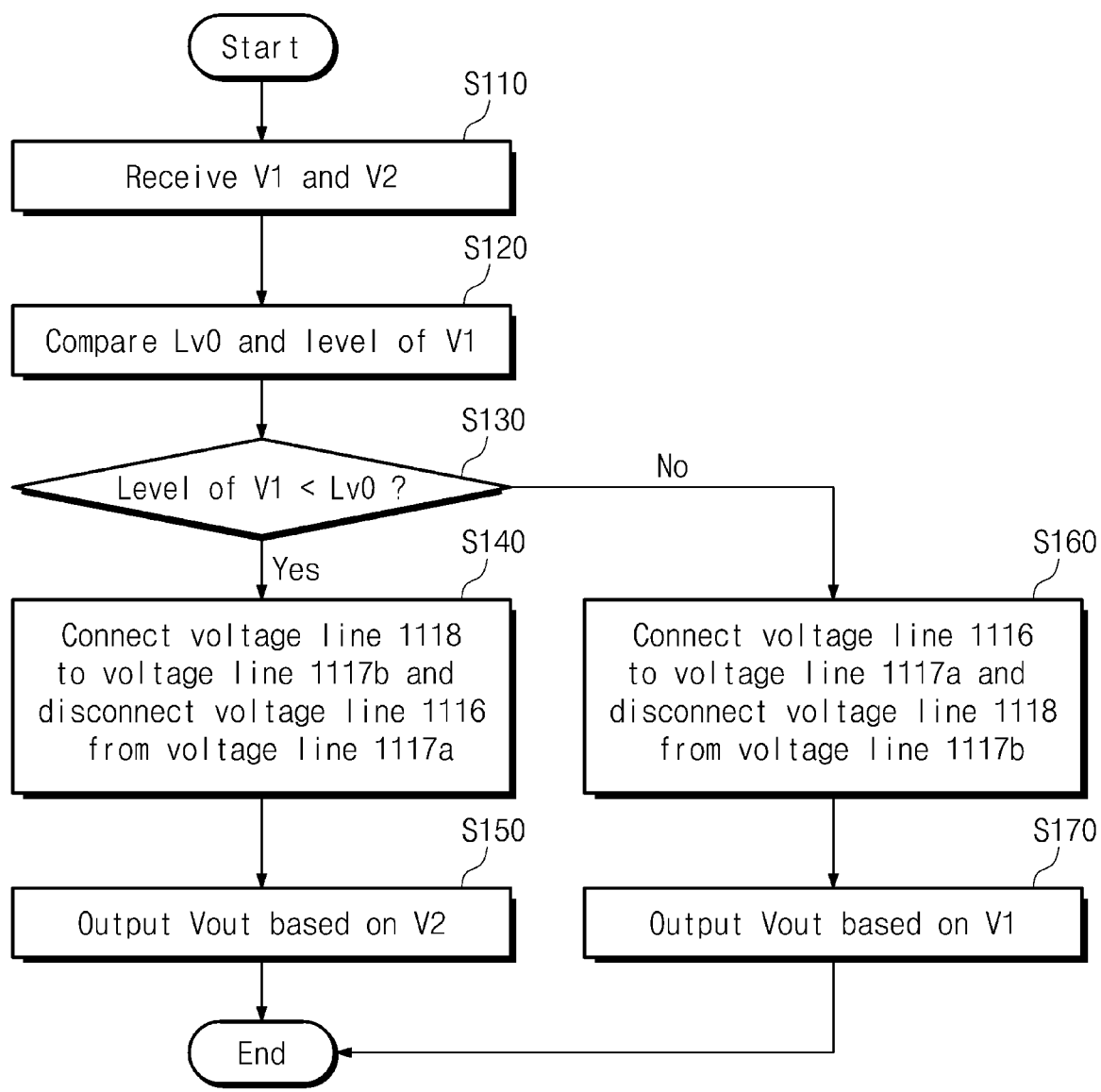
FIG. 10 is a flowchart illustrating an exemplary configuration of a power source switching circuit of FIG. 8.

FIG. 10 is a flowchart illustrating an exemplary configuration of the power source switching circuit 1110*b*-1 of FIG. 8.

In operation S110, the power source switching circuit 1110*b*-1 may receive the voltages V1 and V2. The voltage detector circuit 1111 may receive the voltage V1.

In operation S120, the voltage detector circuit 1111 may compare a level of the received voltage V1 and the reference level Lv0.

In operation S130, the voltage detector circuit 1111 may selectively output the signal S1_d0 or the signal S1_d1, based on a result of comparing the level of the voltage V1 and the reference level Lv0. Also, the voltage detector circuit 1111 may selectively output the signal S2_d0 or the signal S2_d1, based on the result of comparing the level of the voltage V1 and the reference level Lv0.

In the case where the level of the voltage V1 is lower than the reference level Lv0, in operation S140, the voltage detector circuit 1111 may output the signals S1_d0 and S2_d1. In this case, the switch SW1 may disconnect the voltage line 1116 from the voltage line 1117*a* based on the signal S1_d0. The switch SW2 may connect the voltage line 1118 to the voltage line 1117*b* based on the signal S2_d1.

Accordingly, in operation S150, the second output voltage may be output to the voltage line 1117*b*. The voltage regulator circuit 1113-1 may receive the voltage V2 and may output the second output voltage. The second output voltage may be regulated by the voltage regulator circuit 1113-1 so as to have the reference level Lv0. The voltage Vout may be the second output voltage. That is, the voltage Vout may be output based on the voltage V2.

In the case where the level of the voltage V1 is the reference level Lv0 or higher, in operation S160, the voltage detector circuit 1111 may output the signals S1_d1 and S2_d0. In this case, the switch SW1 may connect the voltage line 1116 and the voltage line 1117*a* based on the signal S1_d1. The switch SW2 may disconnect the voltage line 1118 from the voltage line 1117*b* based on the signal S2_d0.

Accordingly, in operation S170, the first output voltage may be output to the voltage line 1117*a*. The voltage Vout may be the first output voltage. That is, the voltage Vout may be output based on the voltage V1.

Operation S110 to operation S170 described with reference to FIG. 10 may correspond to an operation of one interval where the power source switching circuit 1110*b*-1 outputs the voltage Vout based on a result of comparing the level of the voltage V1 and the reference level Lv0. The power source switching circuit 1110*b*-1 may repeatedly perform operation S110 to operation S170 while receiving the voltage V1 and the voltage V2.

Figure 11:
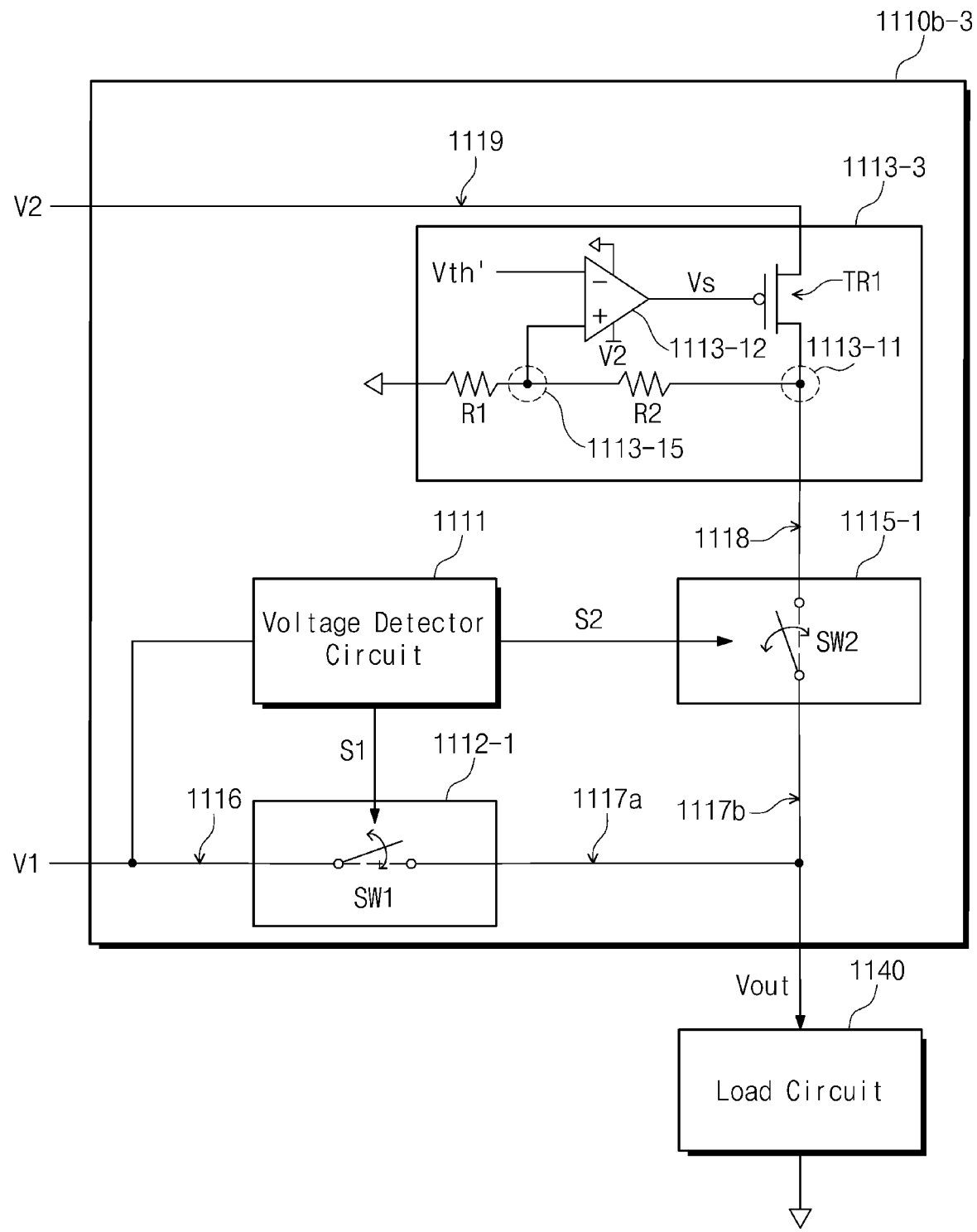
FIG. 11 is a block diagram illustrating an exemplary configuration of a power source switching circuit of FIG. 6.

FIG. 11 is a block diagram illustrating an exemplary configuration of the power source switching circuit 1110*b* of FIG. 6.

In some embodiments, the power source switching circuit 1110*b* of FIG. 6 may include a power source switching circuit 1110*b*-3 of FIG. 11. Components 1111, 1112-1, 1113-3, and 1115-1 of the power source switching circuit 1110*b*-3 illustrated in FIG. 11 may provide operations which are substantially identical of the operations of the components 1111, 1112-1, 1113-1, and 1115-1 of the power source switching circuit 1110*b*-1 illustrated in FIG. 8. However, compared with the voltage regulator circuit 1113-1, the voltage regulator circuit 1113-3 may further include resistors R1 and R2. Below, a description will be mainly focused on a difference between the voltage regulator circuit 1113-3 and the voltage regulator circuit 1113-1, and thus, additional description will be omitted to avoid redundancy.

The voltage regulator circuit 1113-3 may include the amplifier 1113-12, the transistor TR1, and the resistors R1 and R2. The resistors R1 and R2 may be connected in series between the voltage line 1118 and a voltage line to which the ground voltage is supplied.

The amplifier 1113-12 may receive the voltage V2 and the ground voltage through a first power terminal and a second power terminal. The amplifier 1113-12 may receive a voltage Vth' and a voltage of a node 1113-15. The amplifier 1113-12 may receive the voltage of the node 1113-15 and the voltage Vth' through a non-inverting terminal and an inverting terminal, respectively. The node 1113-15 may be located between the serially connected resistors R1 and R2. The voltage of the node 1113-15 may be a voltage which is obtained by dividing a voltage of the node 1113-11 depending on a resistance ratio of the resistors R1 and R2.

In this case, a level Lv0' of the voltage Vth' may be determined based on the reference level Lv0 and resistance values of the resistors R1 and R2. The level Lv0' may be expressed by Equation 1.

$$Lv0' = Lv0 \times \frac{R1}{R1 + R2} \quad \text{[Equation 1]}$$

(Lv0=a level of a reference voltage, R1=a resistance value of the resistor R1, and R2=a resistance value of the resistor R2).

That is, unlike the amplifier 1113-12 illustrated in FIG. 8, the amplifier 1113-12 illustrated in FIG. 11 may receive the voltage Vth' having the level Lv0' through the inverting terminal.

Since the voltage of the node 1113-11 is the second output voltage, the voltage of the node 1113-11 may be regulated to have the reference level Lv0. Accordingly, a level of the voltage of the node 1113-11 may be higher than a level (0 V) of the ground voltage. A difference in level between the voltage of the node 1113-11 and the ground voltage may allow a current to flow to a line, to which the ground voltage is supplied, through the resistors R1 and R2. In the case where a current flows through the resistors R1 and R2, power is consumed by the resistors R1 and R2, and thus, the level of the voltage of the node 1113-11 may decrease.

As described with reference to FIG. 8, a current may flow through the transistor TR1 in the case where the voltage of the node 1113-11, that is, the second output voltage decreases. That is, a current may flow through the transistor TR1 even while the voltage line 1118 is not connected to the voltage line 1117b. The level of the voltage Vout in the case where a current flows through the transistor TR1 even while the voltage line 1118 is not connected to the voltage line 1117b may be regulated to the reference level Lv0 more quickly than in the case where a current starts to flow through the transistor TR1 after the signal S2_d1 is received and the voltage line 1118 is connected to the voltage line 1117b.

Figure 12:
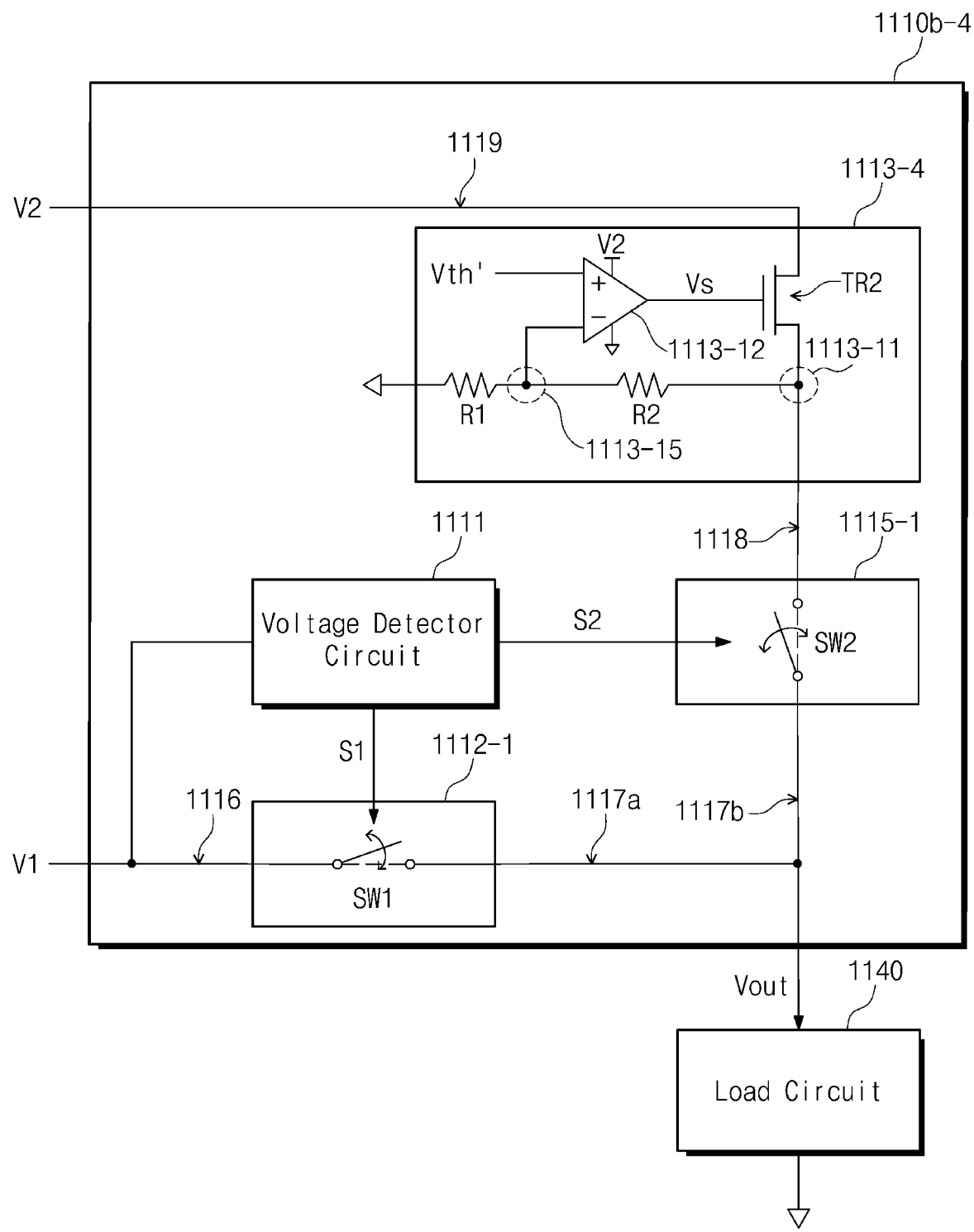
FIG. 12 is a block diagram illustrating an exemplary configuration of a power source switching circuit of FIG. 6.

FIG. 12 is a block diagram illustrating an exemplary configuration of the power source switching circuit 1110b of FIG. 6.

In some embodiments, the power source switching circuit 1110b of FIG. 6 may include a power source switching circuit 1110b-4 of FIG. 12. Components 1111, 1112-1, 1113-4, and 1115-1 of the power source switching circuit 1110b-4 illustrated in FIG. 12 may provide operations which are substantially identical of the operations of the components 1111, 1112-1, 1113-2, and 1115-1 of the power source switching circuit 1110b-2 illustrated in FIG. 9. However, compared with the voltage regulator circuit 1113-2, the voltage regulator circuit 1113-4 may further include resistors R1 and R2. Below, a description will be mainly focused on a difference between the voltage regulator circuit 1113-4 and the voltage regulator circuit 1113-2, and thus, additional description will be omitted to avoid redundancy.

The voltage regulator circuit 1113-4 may include the amplifier 1113-12, the transistor TR2, and the resistors R1 and R2. As described with reference to FIG. 11, the resistors R1 and R2 may be connected in series between the voltage line 1118 and a voltage line to which the ground voltage is supplied.

The amplifier 1113-12 may receive the voltage V2 and the ground voltage through a first power terminal and a second power terminal. The amplifier 1113-12 may receive a voltage from a feedback voltage line and the voltage Vth'. The feedback voltage line may be connected to a node 1113-15 positioned between the resistor R1 and the resistor R2. That is, unlike the amplifier 1113-12 illustrated in FIG. 9, the amplifier 1113-12 illustrated in FIG. 12 may receive the voltage of the node 1113-15 through an inverting terminal. In this case, unlike the amplifier 1113-12 illustrated in FIG. 9, the amplifier 1113-12 illustrated in FIG. 12 may receive the voltage Vth' through a non-inverting terminal. As described with reference to 11, the voltage Vth' may have the level Lv0'.

As described with reference to FIG. 11, by the resistors R1 and R2, a current may flow through the transistor TR2 even while the voltage line 1118 is not connected to the voltage line 1117b. The level of the voltage Vout in the case where a current flows through the transistor TR2 even while the voltage line 1118 is not connected to the voltage line 1117b may be regulated to the reference level Lv0 more quickly than in the case where a current starts to flow through the transistor TR2 after the signal S2_d1 is received and the voltage line 1118 is connected to the voltage line 1117b.

Figure 13:
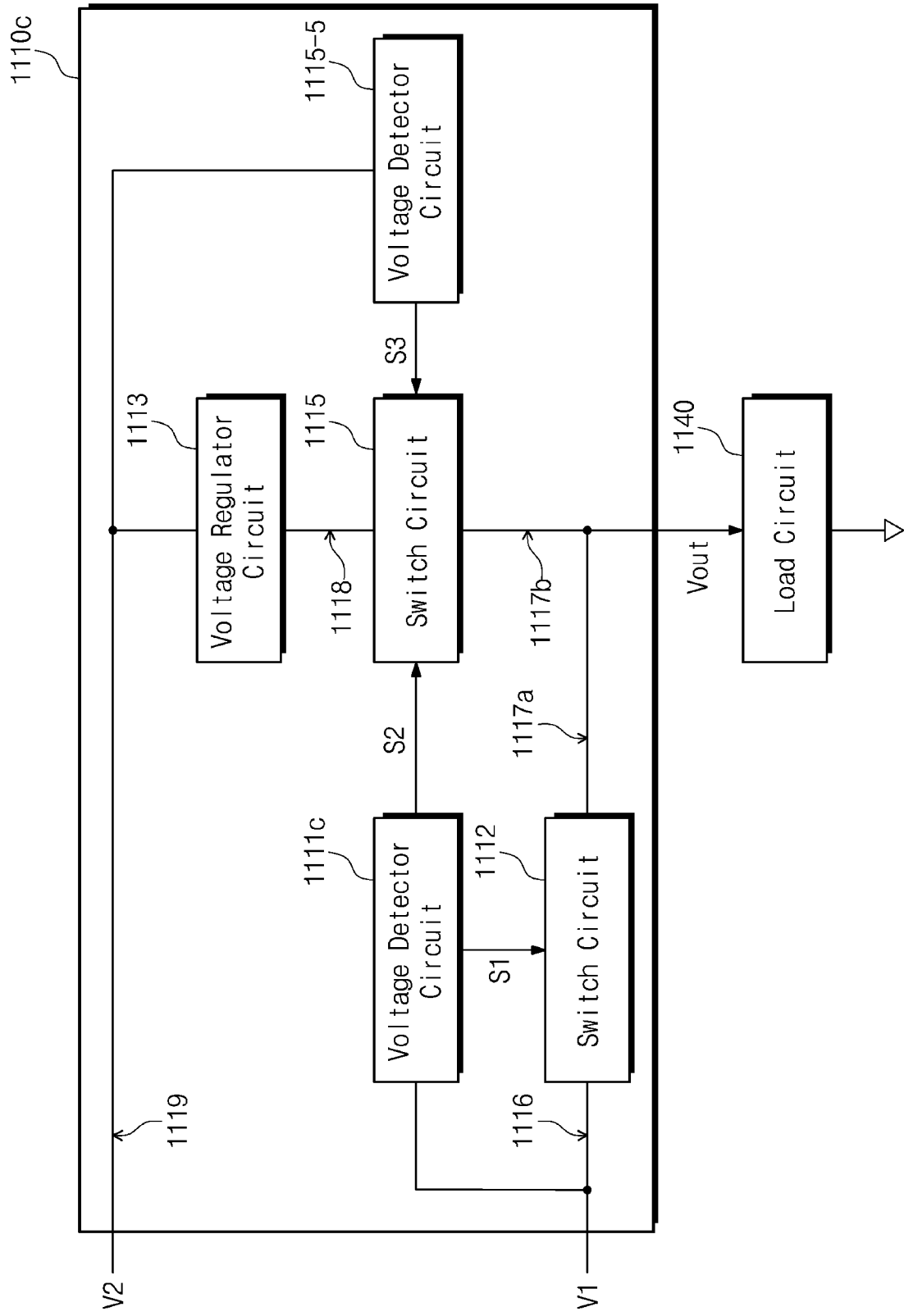
FIG. 13 is a block diagram illustrating an exemplary configuration of a power source switching circuit of FIG. 3.

FIG. 13 is a block diagram illustrating an exemplary configuration of the power source switching circuit 1110 of FIG. 3. For better understanding, FIG. 6 and FIG. 3 will be referenced together to explain FIG. 13.

In some embodiments, the power source switching circuit 1110 of FIG. 3 may include a power source switching circuit 1110c of FIG. 13. Components 1111c, 1112, 1113, and 1115 of the power source switching circuit 1110c illustrated in FIG. 13 may provide operations which are substantially identical of the operations of the components 1111, 1112, 1113, and 1115 of the power source switching circuit 1110b illustrated in FIG. 6. Below, a description will be mainly focused on a difference between the power source switching circuit 1110c and the power source switching circuit 1110b, and thus, additional description will be omitted to avoid redundancy.

The power source switching circuit 1110c may include voltage detector circuits 1111c and 1115-5, the voltage regulator circuit 1113, and the switch circuits 1112 and 1115. The power source switching circuit 1110c may further include the voltage detector circuit 1115-5 compared with the power source switching circuit 1110b of FIG. 6. Unlike the voltage detector circuit 1111 of FIG. 6, the voltage detector circuit 1111c may not output the signal S2. Unlike the switch circuit 1115 of FIG. 6, the switch circuit 1115 may output the second output voltage to the voltage line 1117b based on a signal S3.

The voltage detector circuit 1115-5 may receive the voltage V2 from the power line 1119. The voltage detector circuit 1115-5 may output the signal S3, based on a result of comparing a level of the voltage V2 and a reference level Lv3. The reference level Lv3 may exceed (or be not lower than) the reference level Lv0, and may be lower than (or not higher than) the reference level Lv2.

When a level of the voltage V2 is the reference level Lv3 or higher (or exceeds the reference level Lv3), the voltage detector circuit 1115-5 may output a signal (hereinafter referred to as "S3_d1") having a value of logic "1" or the voltage level d1. When the level of the voltage V2 is lower than (or not higher than) the reference level Lv3, the voltage detector circuit 1115-5 may output a signal (hereinafter referred to as "S3_d0") having a value of logic "0" or the voltage level d0.

The switch circuit 1115 may receive the signal S3 from the voltage detector circuit 1115-5. Based on the signal S3, the switch circuit 1115 may output the second output voltage to the voltage line 1117b or may not output the second output voltage to the voltage line 1117b. For example, the switch circuit 1115 may output the second output voltage to the voltage line 1117b in the case where the signal S3_d1 is received. The switch circuit 1115 may not output the second output voltage in the case where the signal S3_d0 is received.

However, the configuration of the power source switching circuit 1110c illustrated in FIG. 13 is only for convenience of description, and the power source switching circuit 1110c may be configured to include a voltage output circuit outputting a voltage. For example, the voltage output circuit may include the switch circuit 1112 outputting the first output voltage. The voltage output circuit including the switch circuit 1112 may further include the voltage detector circuit 1111c. For another example, the voltage output circuit may include the switch circuit 1115 outputting the second output voltage. The voltage output circuit including the switch circuit 1115 may further include the voltage regulator circuit 1113 and/or the voltage detector circuit 1115-5.

Figure 14:
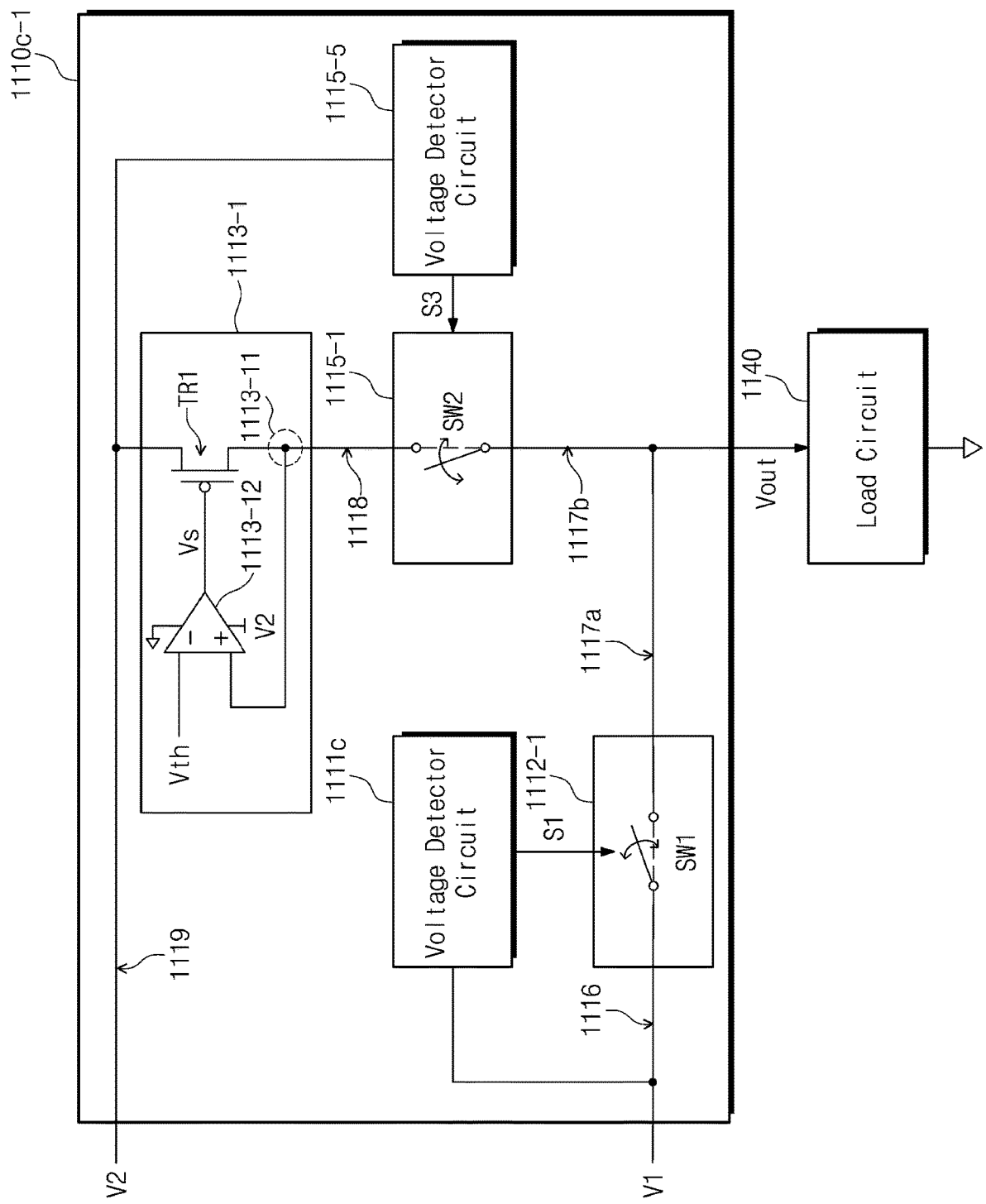
FIG. 14 is a block diagram illustrating an exemplary configuration of a power source switching circuit of FIG. 13.

FIG. 14 is a block diagram illustrating an exemplary configuration of the power source switching circuit 1110c of FIG. 13. For better understanding, FIGS. 8 and 13 will be referenced together.

In some embodiments, the power source switching circuit 1110c of FIG. 13 may include a power source switching circuit 1110c-1 of FIG. 14. Components 1112-1 and 1113-1 of the power source switching circuit 1110c-1 illustrated in FIG. 14 may provide operations which are substantially identical of the operations of the components 1112-1 and 1113-1 of the power source switching circuit 1110b-1 illustrated in FIG. 8. Also, components 1111c, 1115-1, and 1115-5 of the power source switching circuit 1110c-1 illustrated in FIG. 14 may provide operations which are substantially identical of the operations of the components 1111c, 1115, and 1115-5 of the power source switching circuit 1110c illustrated in FIG. 13. Thus, additional description will be omitted to avoid redundancy.

Figure 15:
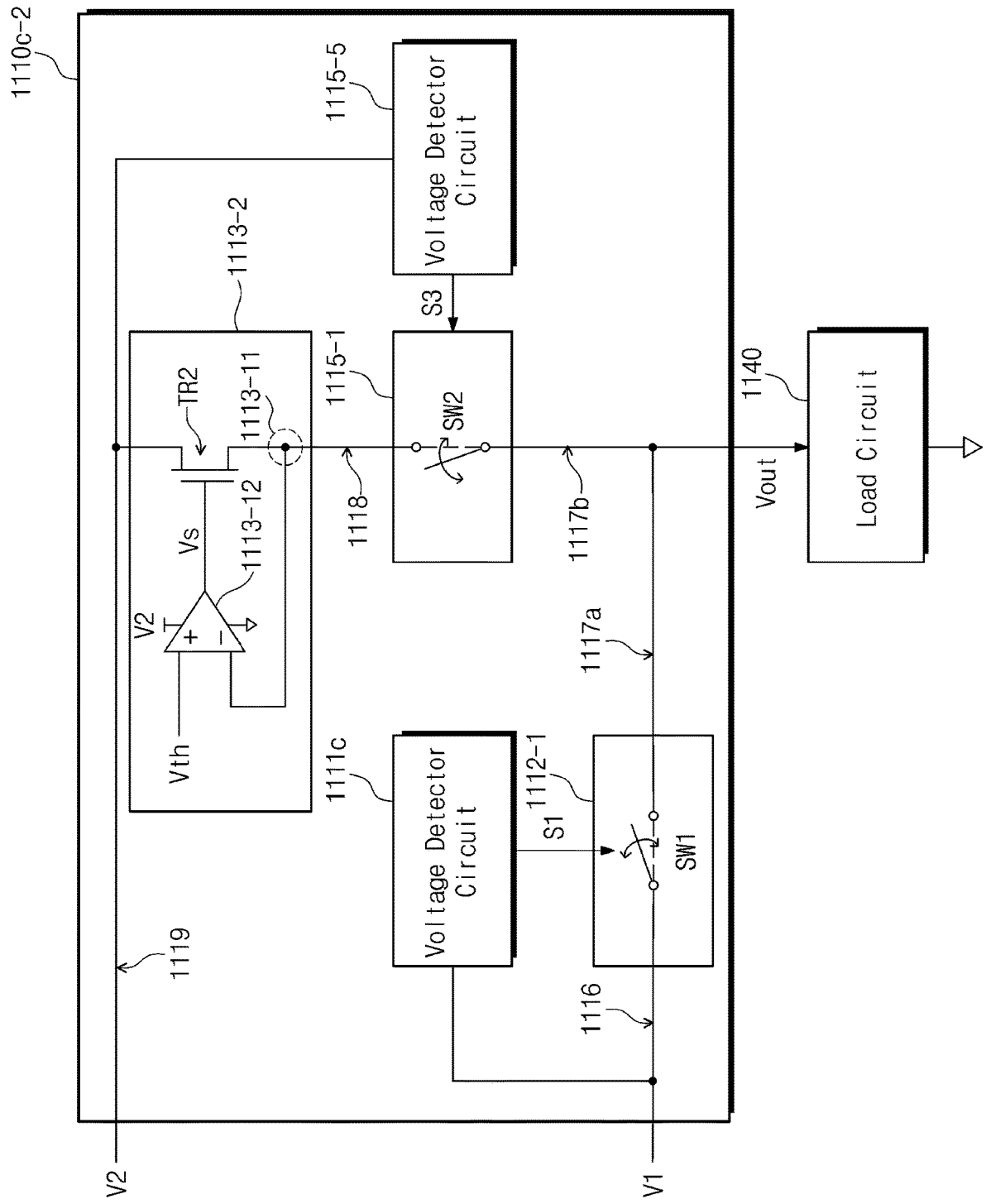
FIG. 15 is a block diagram illustrating an exemplary configuration of a power source switching circuit of FIG. 13.

FIG. 15 is a block diagram illustrating an exemplary configuration of the power source switching circuit 1110c of FIG. 13. For better understanding, FIGS. 9 and 13 will be referenced together.

In some embodiments, the power source switching circuit 1110c of FIG. 13 may include a power source switching circuit 1110c-2 of FIG. 15. Components 1112-1 and 1113-2 of the power source switching circuit 1110c-2 illustrated in FIG. 15 may provide operations which are substantially identical of the operations of the components 1112-1 and 1113-2 of the power source switching circuit 1110b-2 illustrated in FIG. 9. Also, components 1111c, 1115-1, and 1115-5 of the power source switching circuit 1110c-2 illustrated in FIG. 15 may provide operations which are substantially identical of the operations of the components 1111c, 1115, and 1115-5 of the power source switching circuit 1110c illustrated in FIG. 13. Thus, additional description will be omitted to avoid redundancy.

Figure 16:
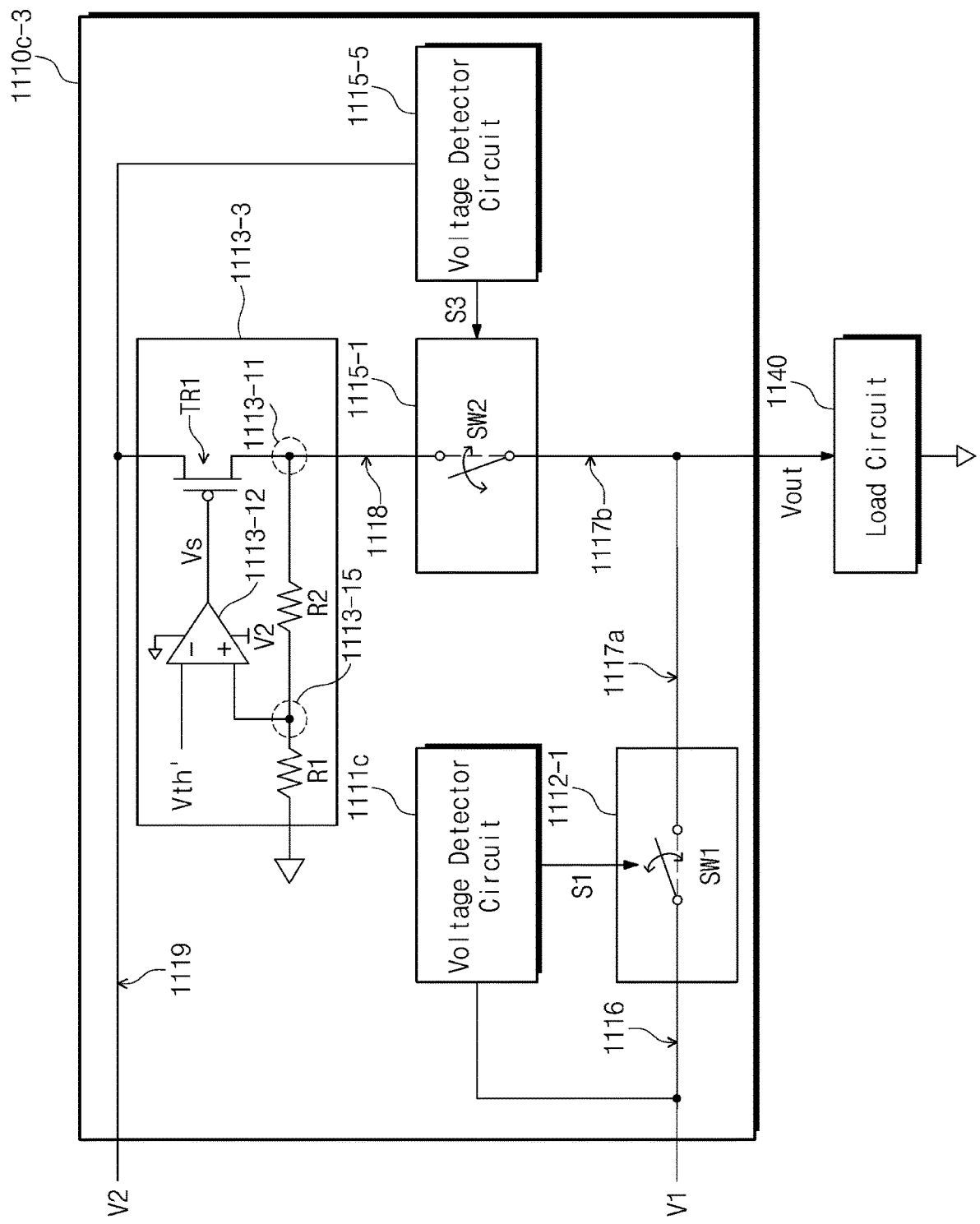
FIG. 16 is a block diagram illustrating an exemplary configuration of a power source switching circuit of FIG. 13.

FIG. 16 is a block diagram illustrating an exemplary configuration of the power source switching circuit 1110c of FIG. 13. For better understanding, FIGS. 11 and 13 will be referenced together.

In some embodiments, the power source switching circuit 1110c of FIG. 13 may include a power source switching circuit 1110c-3 of FIG. 16. Components 1112-1 and 1113-3 of the power source switching circuit 1110c-3 illustrated in FIG. 16 may provide operations which are substantially identical of the operations of the components 1112-1 and 1113-3 of the power source switching circuit 1110b-3 illustrated in FIG. 11. Also, components 1111c, 1115-1, and 1115-5 of the power source switching circuit 1110c-1 illustrated in FIG. 16 may provide operations which are substantially identical of the operations of the components 1111c, 1115, and 1115-5 of the power source switching circuit 1110c illustrated in FIG. 13. Thus, additional description will be omitted to avoid redundancy.

Figure 17:
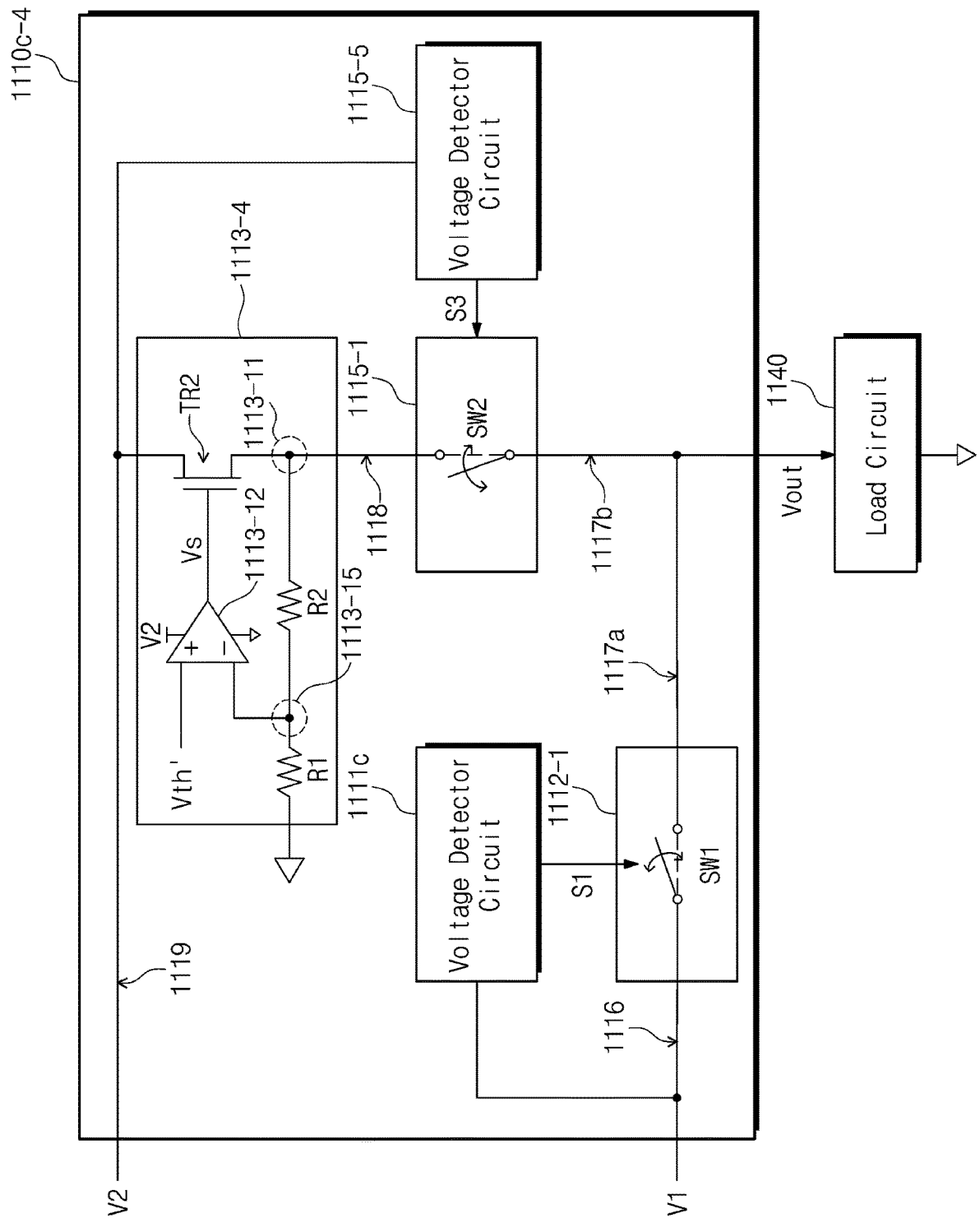
FIG. 17 is a block diagram illustrating an exemplary configuration of a power source switching circuit of FIG. 13.

FIG. 17 is a block diagram illustrating an exemplary configuration of the power source switching circuit 1110c of FIG. 13. For better understanding, FIGS. 12 and 13 will be referenced together.

In some embodiments, the power source switching circuit 1110c of FIG. 13 may include a power source switching circuit 1110c-4 of FIG. 17. Components 1112-1 and 1113-4 of the power source switching circuit 1110c-4 illustrated in FIG. 17 may provide operations which are substantially identical of the operations of the components 1112-1 and 1113-4 of the power source switching circuit 1110b-4 illustrated in FIG. 12. Also, components 1111c, 1115-1, and 1115-5 of the power source switching circuit 1110c-4 illustrated in FIG. 17 may provide operations which are substantially identical of the operations of the components 1111c, 1115, and 1115-5 of the power source switching circuit 1110c illustrated in FIG. 13. Thus, additional description will be omitted to avoid redundancy.

Figure 18:
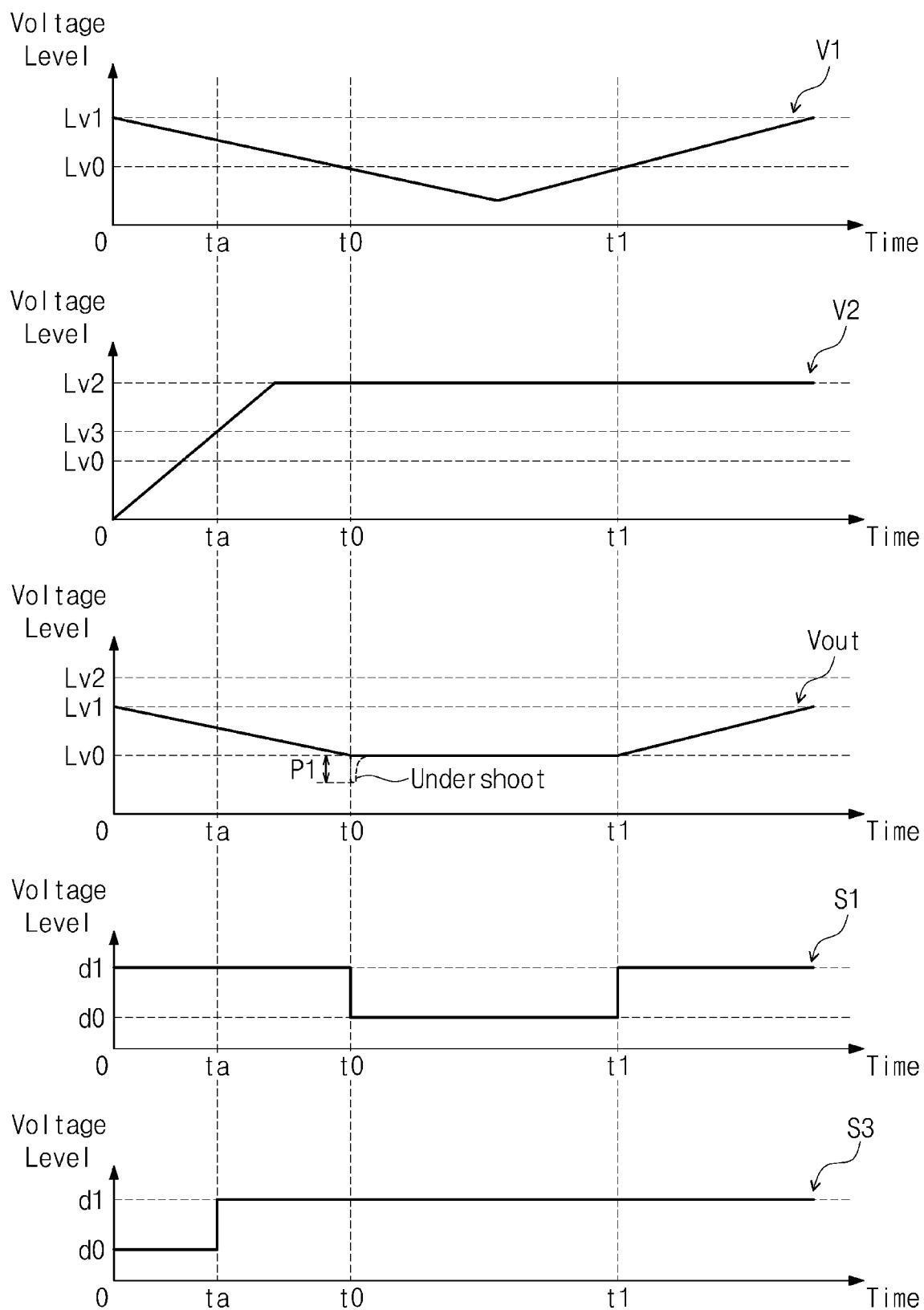
FIG. 18 is a graph illustrating a level of a voltage output from a power source switching circuit of FIG. 17 based on voltages and waveforms of signals.

FIG. 18 is a graph illustrating a level of the voltage Vout output from the power source switching circuit 1110c-4 of FIG. 17 based on the voltages V1 and V2 and waveforms of the signals S1 and S3. A description will be mainly focused on a difference between graphs illustrated in FIG. 18 and graphs illustrated in FIGS. 5 and 7, and additional description will be omitted to avoid redundancy.

In a time interval from a time "0" to a time "t0", the voltage V1 may decrease from the level Lv1 to the reference level Lv0. The voltage V2 may be maintained at the level Lv2 after being increased from the level of 0 V to the level Lv2. From a time "ta", the voltage V2 may have a level which is the reference level Lv3 or higher.

In a time interval from the time "0" to the time "t0", the voltage detector circuit 1111c may output the signal S1_d1. The switch circuit 1112-1 may output the first output voltage based on the signal S1_d1. Accordingly, the voltage Vout may be the first output voltage.

In a time interval from the time "0" to the time "ta", the voltage detector circuit 1115-5 may output the signal S3_d0. In a time interval from the time "ta" to the time "t0", the voltage detector circuit 1115-5 may output the signal S3_d1. Unlike the signal S2 illustrated in FIGS. 5 and 7, the signal S3 may have the voltage level d1 in the time interval from the time "ta" to the time "t0". Accordingly, the switch circuit 1115-1 may connect the voltage line 1118 to the voltage line 1117b from the time "ta" based on the signal S3_d1.

That is, the voltage line 1118 may be connected to the voltage line 1117b before the voltage line 1116 is disconnected from the voltage line 1117a. Accordingly, in the case where a level of the voltage Vout is lower than the reference level Lv1 after the time "ta", the switch circuit 1115-1 may instantly output the second output voltage to the voltage line 1117b without disconnection due to a switching operation of connecting the voltage line 1118 to the voltage line 1117b.

In the case where the voltage line 1118 is connected to the voltage line 1117b, a voltage of the node 1113-11 may have a level of the voltage Vout. In the case where a level of the voltage of the node 1113-11 is lower than the reference level Lv0, a current may flow from the voltage line 1119 to the voltage line 1118 through the transistor TR2. In the case where the level of the voltage of the node 1113-11 is the reference level Lv0 or higher, a current may not flow from the voltage line 1119 to the voltage line 1118.

That is, independently of the operations of the voltage detector circuit 1111c and the switch circuit 1112-1, in the case where the voltage line 1118 is connected to the voltage line 1117b and the level of the voltage Vout is lower than the reference level Lv0, a current may flow from the voltage line 1119 to the voltage line 1117b. However, in the case where the level of the voltage Vout is the reference level Lv0 or higher even though the voltage line 1118 is connected to the voltage line 1117b, a current may not flow from the voltage line 1119 to the voltage line 1118.

The power source switching circuit 1110c-4 may output a stable voltage Vout by skipping the operation of connecting the voltage line 1118 to the voltage line 1117b at a time (e.g., t0) at which the level of the voltage Vout is lower than the reference level Lv0. That is, the power source switching circuit 1110c-4 may reduce a change in the level of the voltage Vout and a magnitude of the undershooting at the time (e.g., t0) at which a power source supplying the voltage Vout is switched from the voltage V1 to the voltage V2. The magnitude P1 of the undershooting illustrated in FIG. 18 may be smaller than the magnitude P0 of the undershooting illustrated in FIG. 5. Accordingly, an abnormal operation of the load circuit 1140 may decrease.

Figure 19:
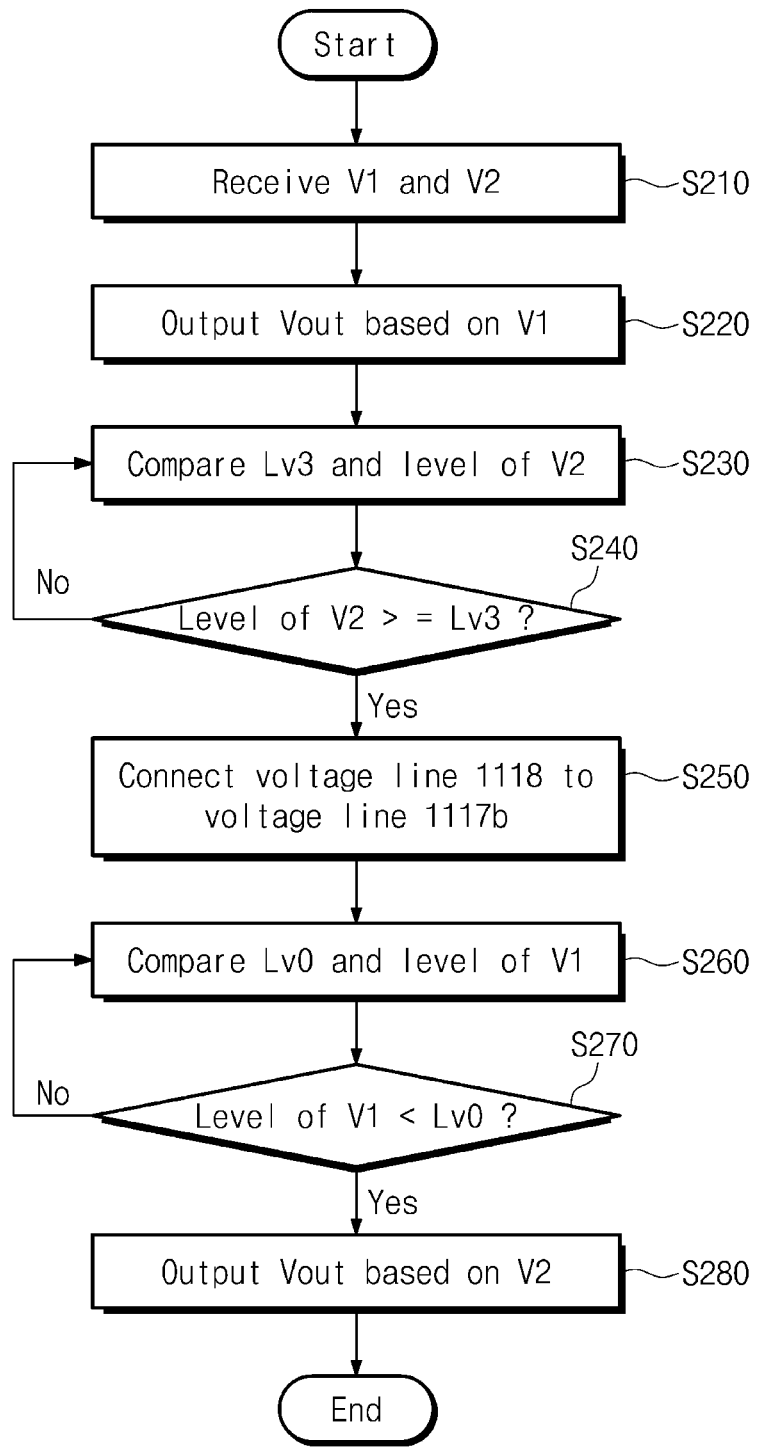
FIG. 19 is a flowchart illustrating an exemplary configuration of a power source switching circuit of FIG. 17.

FIG. 19 is a flowchart illustrating an exemplary configuration of the power source switching circuit 1110c-4 of FIG. 17. An operation of the power source switching circuit 1110c-4 in a time interval from the time "0" to the time "t1" illustrated in FIG. 18 will be described with reference to FIG. 19.

In operation S210, the power source switching circuit 1110c-4 may receive the voltages V1 and V2. The voltage detector circuit 1111c may receive the voltage V1. The voltage detector circuit 1115-5 may receive the voltage V2.

In the time interval from the time "0" to the time "t0", the voltage V1 may be higher than the reference level Lv0. In this case, in operation S220, the switch SW1 may connect the voltage line 1116 and the voltage line 1117a. The first output voltage may be output to the voltage line 1117a. That is, the voltage Vout may be output based on the voltage V1.

In operation S230, the voltage detector circuit 1115-5 may compare a level of the received voltage V2 and the reference level Lv3.

In operation S240, the voltage detector circuit 1115-5 may selectively output the signal S3_d0 or the signal S3_d1, based on a result of comparing the level of the voltage V2 and the reference level Lv3.

In the time interval from the time "ta" to the time "t1", the level of the voltage V2 may be the reference level Lv3 or higher. In this case, in operation S250, the voltage detector circuit 1115-5 may output the signal S3_d1. The switch SW2 may connect the voltage line 1118 to the voltage line 1117b based on the signal S3_d1.

In the case where the level of the voltage V2 is lower than the reference level Lv3, the power source switching circuit 1110c-4 may repeat operation S230 and operation S240.

In operation S260, the voltage detector circuit 1111c may compare a level of the received voltage V1 and the reference level Lv0.

In operation S270, the voltage detector circuit 1111c may selectively output the signal S1_d0 or the signal S1_d1, based on a result of comparing the level of the voltage V1 and the reference level Lv0.

In the time interval from the time "0" to the time "t1", the level of the voltage V1 may be lower than the reference level Lv0. In this case, the level of the voltage Vout may be lower than the reference level Lv0. Accordingly, as described with reference to FIG. 18, in operation S280, the second output voltage may be output to the voltage line 1117b. That is, the voltage Vout may be output based on the voltage V2. Also, the voltage detector circuit 1111c may output the signal S1_d0. The switch SW1 may disconnect the voltage line 1116 from the voltage line 1117b based on the signal S1_d0.

In contrast, in the case where the level of the voltage V1 is the reference level Lv0 or higher, the power source switching circuit 1110c-4 may repeat operation S260 and operation S270.

According to an embodiment of the disclosure, an electronic circuit may output a stable voltage even in the case where a magnitude of a received voltage changes. The electronic circuit may reduce a change in a magnitude of an output voltage, which is made in a time interval where a power source supplying the output voltage is switched. Accordingly, an abnormal operation which occurs at a circuit supplied with the output voltage from the electronic circuit may be reduced.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. A power source switching circuit comprising:
a first voltage detector circuit configured to generate a first signal based on a comparison of a first voltage received from a first node and a first reference voltage;
a second voltage detector circuit configured to generate a second signal based on a comparison of a second voltage received from a second node and a second reference voltage greater than the first reference voltage;
a voltage regulator circuit configured to receive the second voltage from the second node and to output a regulated third voltage to a third node;
a first switch circuit configured to operate in response to the first signal, wherein the first switch circuit is connected between the first node and an output node, and wherein the first switch circuit is turned-on to output the first voltage to the output node in response to the first signal when a voltage level of the first voltage is greater than a voltage level of the first reference voltage; and
a second switch circuit configured to operate in response to the second signal, wherein the second switch circuit is connected between the third node and the output node, and wherein the second switch circuit is turned-on to output the regulated third voltage to the output node in response to the second signal when the voltage level of the second voltage is greater than the voltage level of the second reference voltage, wherein:
the voltage regulator circuit comprises:
a first resistor connected between a ground voltage and a fourth node;
a second resistor connected between the third node and the fourth node;
an amplifier comprising a first input terminal connected to the fourth node, a second input terminal receiving a fourth voltage which is generated based on the first reference voltage, and an output terminal; and
a transistor configured to operate in response to a voltage level of the output terminal, wherein the transistor is connected between the second node and the third node.

2. The power source switching circuit of claim 1, wherein the transistor is an NMOS (n-channel metal oxide semiconductor) transistor.

3. The power source switching circuit of claim 2, wherein the first input terminal is an inverting terminal of the amplifier and the second input terminal is a non-inverting terminal of the amplifier.

4. The power source switching circuit of claim 3, wherein the amplifier further comprises a first power terminal connected to the ground voltage and a second power terminal receiving the second voltage.

5. The power source switching circuit of claim 1, wherein:
when the voltage level of the first voltage is lower than the voltage level of the first reference voltage, the first switch circuit is turned-off in response to the first signal.

6. The power source switching circuit of claim 5, wherein:
when the voltage level of the second voltage is lower than the voltage level of the second reference voltage, the second switch circuit is turned-off in response to the second signal.

7. The power source switching circuit of claim 1, wherein: a voltage level of the fourth voltage is determined by equation 1, $$V4 = Lv0 \times \frac{R1}{R1+R2}, \quad \text{[Equation 1]}$$

and
V4 is the voltage level of the fourth voltage, Lv0 is a voltage level of the first reference voltage, R1 is a resistance value of the first resistor, and R2 is a resistance value of the second resistor.

8. The power source switching circuit of claim 1, wherein a voltage level of the regulated third voltage is regulated to the voltage level of the first reference voltage.

9. The power source switching circuit of claim 8, wherein a voltage level of the fourth voltage is lower than the voltage level of the first reference voltage.

10. An electronic circuit comprising:
a load circuit;
a first voltage detector circuit configured to generate a first signal based on a comparison of a first voltage and a first reference voltage;
a second voltage detector circuit configured to generate a second signal based on a comparison of a second voltage and a second reference voltage greater than the first reference voltage;
a voltage regulator circuit configured to output a regulated third voltage by regulating the second voltage;
a first voltage output circuit configured to output a first output voltage by selectively providing the first voltage to the load circuit in response to the first signal when a voltage level of the first voltage is greater than a voltage level of the first reference voltage; and
a second voltage output circuit configured to output a second output voltage by selectively providing the regulated third voltage to the load circuit in response to the second signal when the voltage level of the second voltage is greater than the voltage level of the second reference voltage, wherein:
the voltage regulator circuit comprises:
an NMOS (n-channel metal oxide semiconductor) transistor comprising a drain terminal receiving the second voltage, a source terminal outputting the regulated third voltage, and a gate terminal;
a first resistor connected between a ground voltage and a first node;
a second resistor connected between the first node and the source terminal; and
an amplifier comprising a non-inverting terminal receiving a fourth voltage, an inverting terminal connected to the first node, and an output terminal connected to the gate terminal.

11. The electronic circuit of claim 10, wherein:
a voltage level of the fourth voltage is determined by equation 2, $$V4 = Lv0 \times \frac{R1}{R1+R2}, \quad \text{[Equation 2]}$$

and
V4 is the voltage level of the fourth voltage, Lv0 is a voltage level of the first reference voltage, R1 is a resistance value of the first resistor, and R2 is a resistance value of the second resistor.

12. The electronic circuit of claim 10, wherein a voltage level of the regulated third voltage is regulated to the voltage level of the first reference voltage.

13. The electronic circuit of claim 12, wherein a voltage level of the fourth voltage is lower than the voltage level of the first reference voltage.

* * * * *